US012804953B2

(12) United States Patent
Shimomori et al.

(10) Patent No.: US 12,804,953 B2
(45) Date of Patent: Nov. 17, 2026

(54) SEMICONDUCTOR DEVICE AND SEMICONDUCTOR STORAGE DEVICE

(71) Applicant: Kioxia Corporation, Tokyo (JP)

(72) Inventors: Ken Shimomori, Yokkaichi Mie (JP); Takuya Kikuchi, Yokkaichi Mie (JP); Ryosuke Yamamoto, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 658 days.

(21) Appl. No.: 18/178,464

(22) Filed: Mar. 3, 2023

(65) Prior Publication Data

US 2023/0387317 A1 Nov. 30, 2023

(30) Foreign Application Priority Data

May 30, 2022 (JP) ................................ 2022-087978

(51) Int. Cl.
*H01L 29/786* (2006.01)
*H10B 12/00* (2023.01)
*H10D 30/67* (2025.01)

(52) U.S. Cl.
CPC ......... *H10D 30/6755* (2025.01); *H10B 12/30* (2023.02)

(58) Field of Classification Search
CPC ........... H10D 30/6755; H10D 30/6728; H10B 12/30; H10B 12/05; H10B 12/33
See application file for complete search history.

(56) References Cited

U.S. PATENT DOCUMENTS

| | | | | |
|---|---|---|---|---|
| 9,859,439 | B2 * | 1/2018 | Miyairi | H10D 30/6755 |
| 10,312,239 | B2 * | 6/2019 | Tezuka | H10D 30/6755 |
| 10,461,184 | B1 * | 10/2019 | Cheng | H10D 30/63 |
| 10,553,601 | B2 * | 2/2020 | Tezuka | H10B 43/30 |
| 10,714,629 | B2 * | 7/2020 | Saito | H10D 30/6728 |
| 10,790,396 | B2 | 9/2020 | Sawabe | |
| 11,335,788 | B2 | 5/2022 | Ramaswamy | |
| 11,462,542 | B2 * | 10/2022 | Wada | H10B 12/488 |
| 11,502,204 | B2 * | 11/2022 | Gawase | H10D 30/6755 |
| 11,871,557 | B2 * | 1/2024 | Shiokawa | H10B 12/33 |
| 12,137,550 | B2 * | 11/2024 | Xiao | H10D 30/6755 |
| 12,432,905 | B2 * | 9/2025 | Xiao | H10B 12/312 |

(Continued)

FOREIGN PATENT DOCUMENTS

| | | | |
|---|---|---|---|
| JP | 2019169490 | A | 10/2019 |
| JP | 2020198343 | A | 12/2020 |
| JP | 2021153082 | A | 9/2021 |

*Primary Examiner* — Jay C Kim
(74) *Attorney, Agent, or Firm* — Kim & Stewart LLP

(57) ABSTRACT

According to one embodiment, a semiconductor device includes a first electrode, a second electrode, an oxide semiconductor layer provided between the first electrode and the second electrode, a gate electrode surrounding the oxide semiconductor layer, a gate insulating layer provided between the gate electrode and the oxide semiconductor layer and separated from the first electrode, a first insulating layer provided between the first electrode and the gate electrode. The gate insulating layer is between first insulating layer and the oxide semiconductor layer, and a second insulating layer is provided between the first electrode and the first insulating layer. The second insulating layer has a chemical composition or density that is different from that of the first insulating layer.

19 Claims, 25 Drawing Sheets

(56) References Cited

U.S. PATENT DOCUMENTS

| | | | | |
|---|---|---|---|---|
| 12,507,419 | B2 * | 12/2025 | Wu | H10B 61/22 |
| 12,581,688 | B2 * | 3/2026 | Shiokawa | H10D 30/6728 |
| 2014/0273373 | A1 * | 9/2014 | Makala | H10D 84/038 438/270 |
| 2020/0381557 | A1 | 12/2020 | Hattori | |
| 2021/0082921 | A1 * | 3/2021 | Wada | H10B 12/036 |
| 2021/0305431 | A1 | 9/2021 | Ishimaru | |
| 2021/0376157 | A1 * | 12/2021 | Doornbos | H10D 30/6728 |
| 2023/0299206 | A1 * | 9/2023 | Sakuma | H10B 12/05 |
| 2024/0315043 | A1 * | 9/2024 | Fujii | H10B 51/10 |

* cited by examiner

SEMICONDUCTOR DEVICE AND SEMICONDUCTOR STORAGE DEVICE

CROSS-REFERENCE TO RELATED APPLICATION

This application is based upon and claims the benefit of priority from Japanese Patent Application No. 2022-087978, filed May 30, 2022, the entire contents of which are incorporated herein by reference.

FIELD

Embodiments described herein relate generally to a semiconductor device and a semiconductor storage device.

BACKGROUND

An oxide semiconductor transistor having a channel formed in an oxide semiconductor layer has an excellent characteristic of a very low channel leakage current in off-operation. Therefore, an oxide semiconductor transistor may be used as a switching transistor of a memory cell of Dynamic Random Access Memory (DRAM).

DETAILED DESCRIPTION

Figure 1:
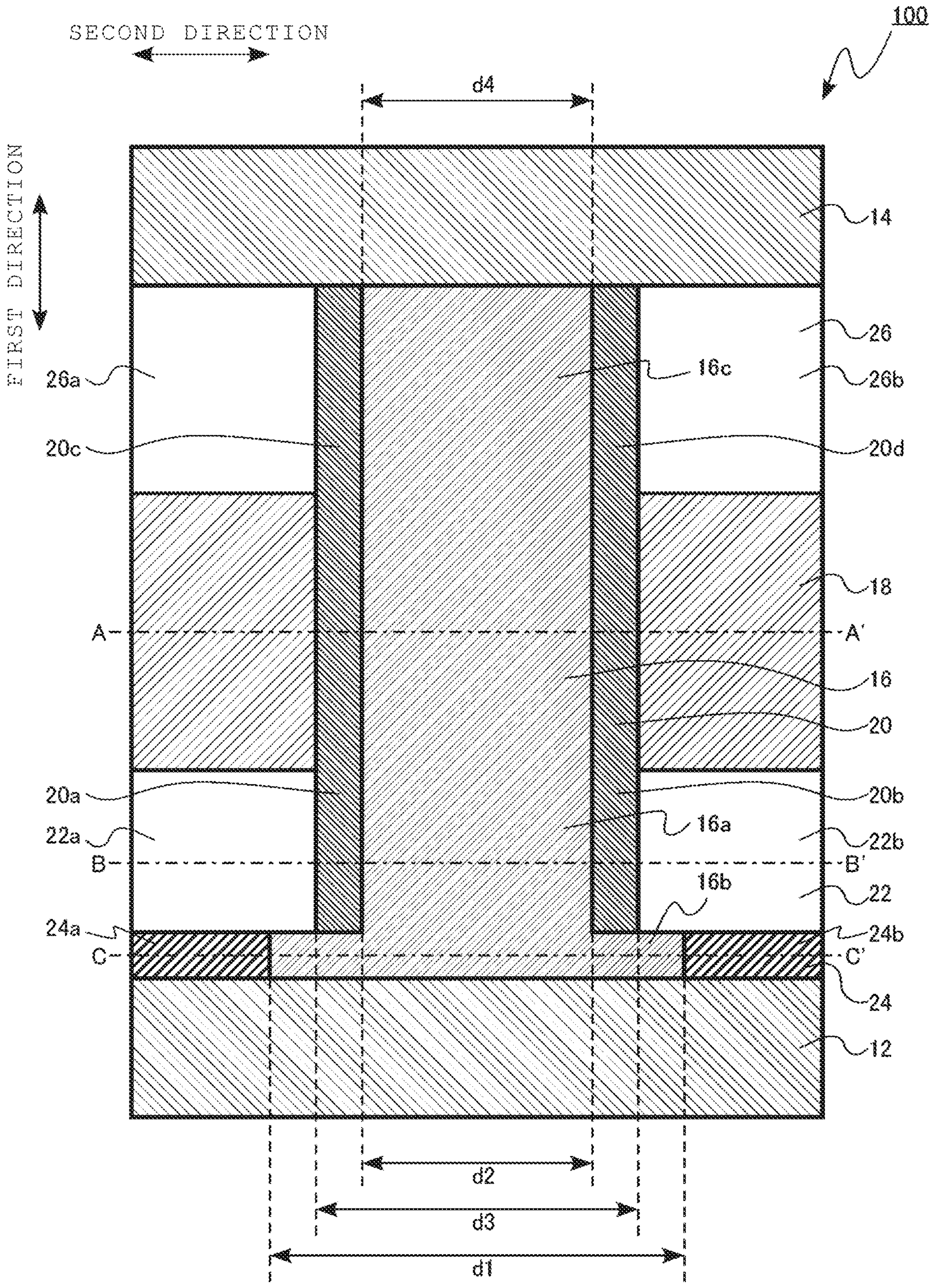
FIG. 1 is a schematic cross-sectional view of a semiconductor device according to a first embodiment.

Embodiments concern a semiconductor device having excellent transistor characteristics for various applications.

In general, according to one embodiment, a semiconductor device includes a first electrode, a second electrode, an oxide semiconductor layer provided between the first electrode and the second electrode, a gate electrode surrounding the oxide semiconductor layer, a gate insulating layer provided between the gate electrode and the oxide semiconductor layer and separated from the first electrode, a first insulating layer provided between the first electrode and the gate electrode. The gate insulating layer is between first insulating layer and the oxide semiconductor layer. A second insulating layer is provided between the first electrode and the first insulating layer and has a chemical composition or density that is different from that of the first insulating layer.

Certain, non-limiting example embodiments of the present disclosure will be described with reference to the drawings. In the following, components, members, aspects, or the like that are the same or substantially the same are denoted by the same reference symbols, and once such a component, member, aspect, or the like has already been described repeated description may be omitted as appropriate.

In the description, the terms "up,", "down", "upper", or "lower" may be used herein for convenience. But such terms as "up", "down", "upper", and "lower" indicate relative positional relationships in the drawings, and are not necessarily terms that define positional relationships with respect to gravity.

The qualitative and quantitative analyses on the chemical compositions of the components, materials, and the like forming a semiconductor device and/or a semiconductor storage device can be performed by, for example, Secondary Ion Mass Spectrometry (SIMS), Energy Dispersive X-ray Spectroscopy (EDX), and Rutherford Back-Scattering Spectroscopy (RBS). Further, for example, Transmission Electron Microscope (TEM) can be used for measuring thickness of components, materials, members, and the like forming a semiconductor device or a semiconductor storage device as well as distances between such components, materials, and members and characteristics or properties such as crystal grain sizes or the like.

First Embodiment

A semiconductor device according to a first embodiment includes a first electrode, a second electrode, an oxide semiconductor layer provided between the first electrode and the second electrode, a gate electrode surrounding the oxide semiconductor layer, and a gate insulating layer provided between the gate electrode and the oxide semiconductor layer and spaced apart from the first electrode. A first insulating layer is provided between the first electrode and the gate electrode. The gate insulating layer is between the first insulating layer and the oxide semiconductor layer. A second insulating layer is provided between the first electrode and the first insulating layer and has a chemical composition or density that is different from that of the first insulating layer.

Figure 2:
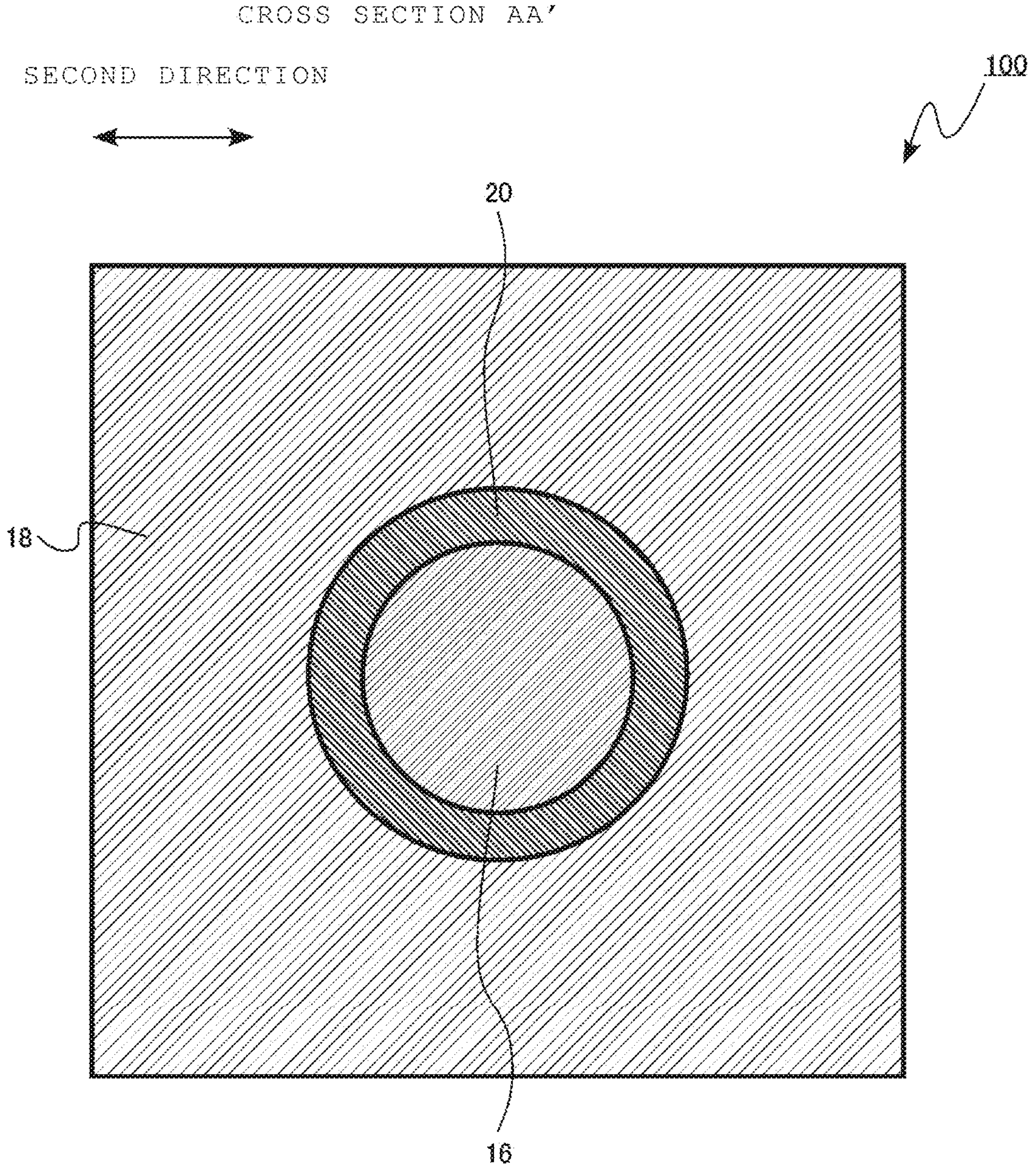
FIG. 2 is a schematic cross-sectional view of a semiconductor device according to a first embodiment.
Figure 3:
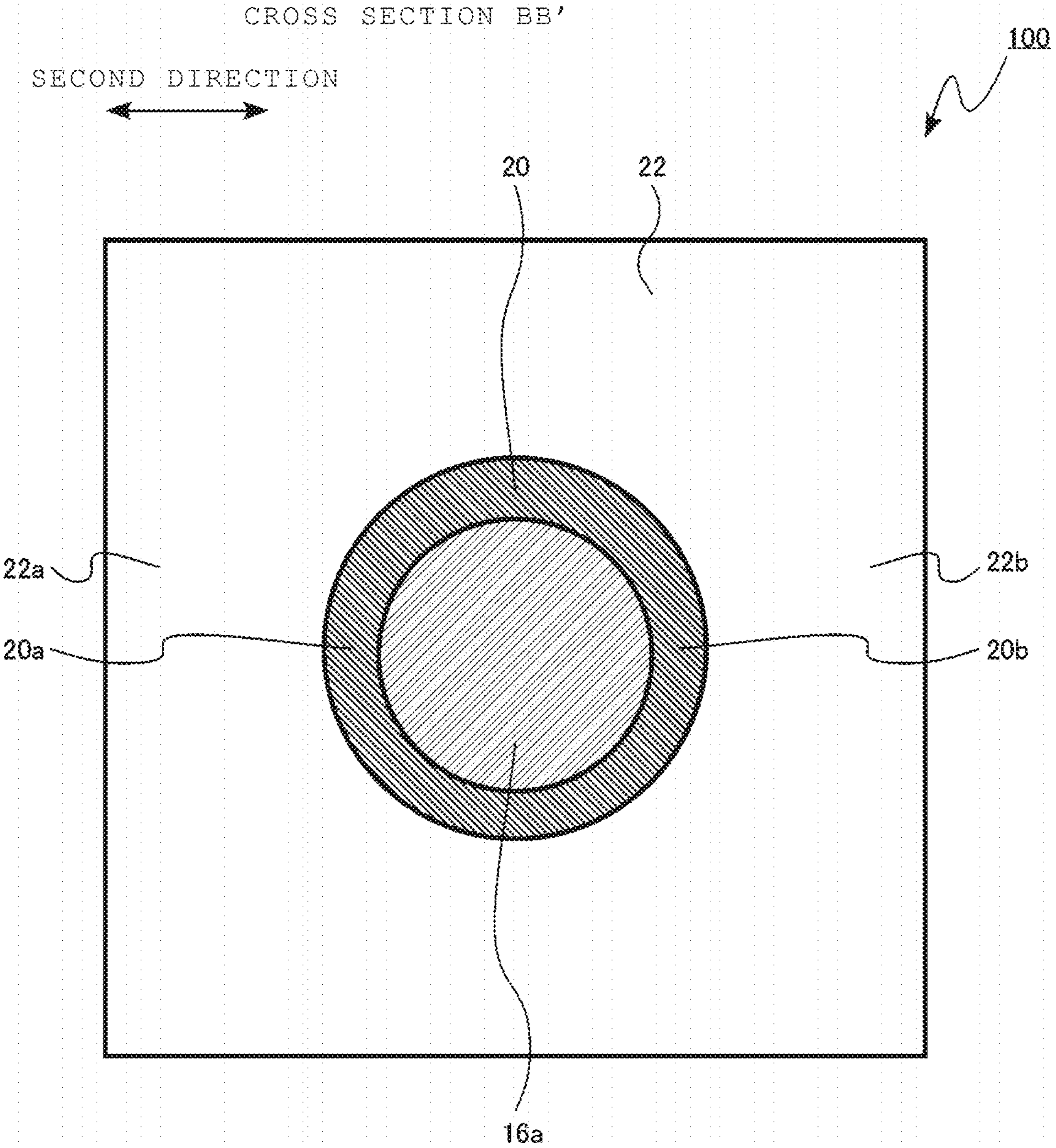
FIG. 3 is a schematic cross-sectional view of a semiconductor device according to a first embodiment.
Figure 4:
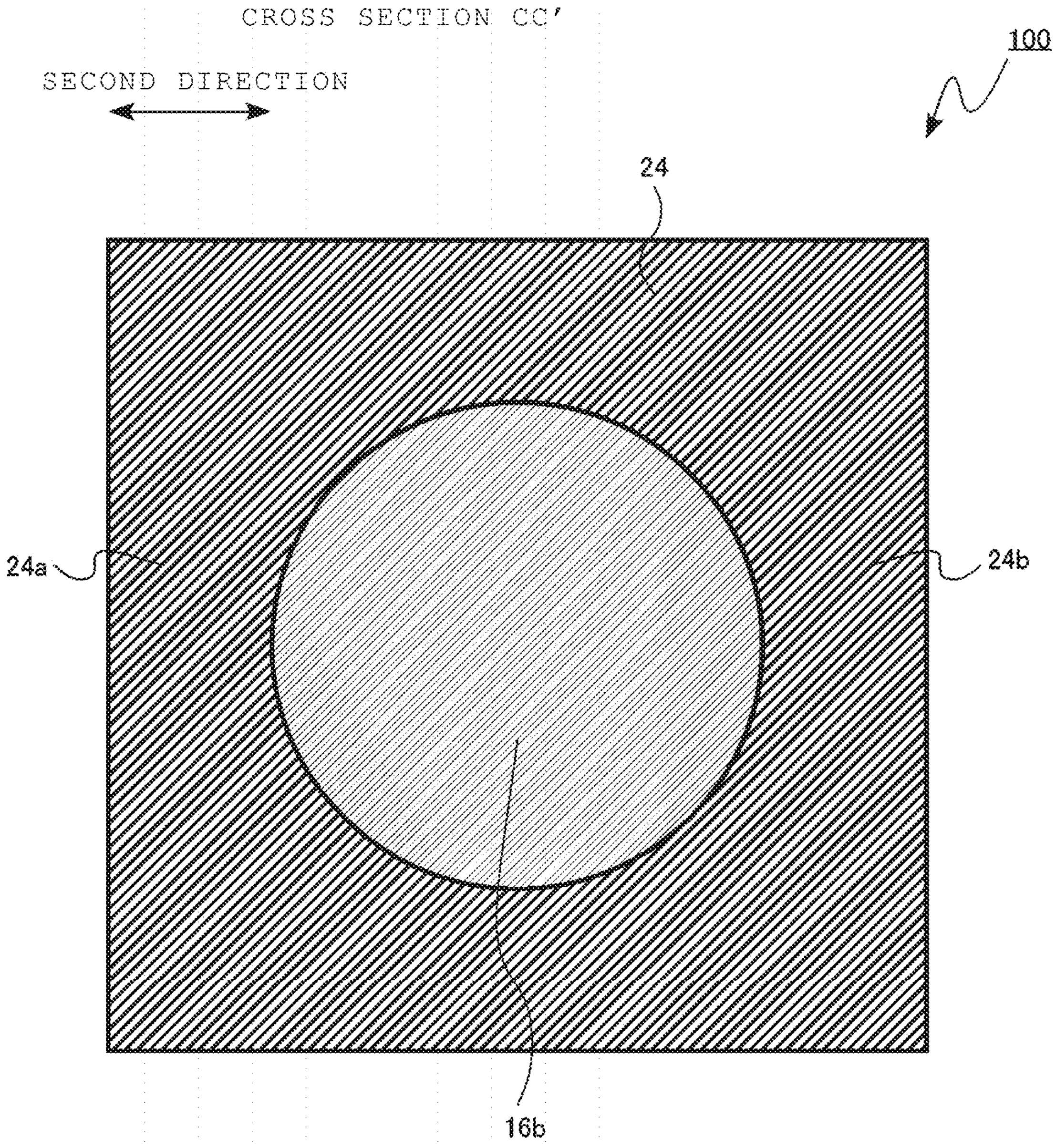
FIG. 4 is a schematic cross-sectional view of a semiconductor device according to a first embodiment.

FIGS. 1, 2, 3, and 4 are schematic cross-sectional views showing the semiconductor device according to a first embodiment. FIG. 2 is a cross-sectional view taken along line AA' of FIG. 1. FIG. 3 is a cross-sectional view taken along line BB' of FIG. 1. FIG. 4 is a cross-sectional view taken along line CC' of FIG. 1. In FIG. 1, a vertical direction (also referred to as a first direction) is depicted. In FIG. 1, a horizontal direction (also referred to as a second direction) is depicted. The second direction is perpendicular to the first direction.

A semiconductor device according to the first embodiment is a transistor 100. The transistor 100 is an oxide semiconductor transistor in which a channel is formed in an oxide semiconductor material. The transistor 100 includes a gate electrode 18 surrounding an oxide semiconductor layer 16 in which the channel is formed. The transistor 100 is a so-called surrounding gate transistor (SGT). The transistor 100 is also a so-called vertical transistor.

The transistor 100 includes a lower electrode 12, an upper electrode 14, an oxide semiconductor layer 16, a gate electrode 18, a gate insulating layer 20, a lower insulating layer 22, a protective insulating layer 24, and an upper insulating layer 26. The oxide semiconductor layer 16 includes a first region 16*a*, a second region 16*b*, and a third region 16*c*. The lower insulating layer 22 includes a first portion 22*a* and a second portion 22*b*. The protective insulating layer 24 includes a third portion 24*a* and a fourth portion 24*b*. The gate insulating layer 20 includes a fifth portion 20*a*, a sixth portion 20*b*, a ninth portion 20*c* and a tenth portion 20*d*. The upper insulating layer 26 includes a seventh portion 26*a* and an eighth portion 26*b*.

The lower electrode 12 is an example of a first electrode. The upper electrode 14 is an example of a second electrode. The lower insulating layer 22 is an example of a first insulating layer. The protective insulating layer 24 is an example of a second insulating layer. The upper insulating layer 26 is an example of a third insulating layer.

The lower electrode 12 is provided under the oxide semiconductor layer 16. The lower electrode 12 is electrically connected to the oxide semiconductor layer 16. For example, the lower electrode 12 is in direct contact with the oxide semiconductor layer 16. The lower electrode 12 serves as a source electrode or a drain electrode of the transistor 100.

The lower electrode 12 is a conductor (conductive material). For example, the lower electrode 12 is an oxide conductor (conductive oxide). For example, the lower electrode 12 comprises indium (In), tin (Sn), and oxygen (O). For example, the lower electrode 12 comprises indium tin oxide (ITO). For example, the lower electrode 12 is an indium tin oxide (ITO) layer.

In some examples, the lower electrode 12 includes or comprises a metal. For example, the lower electrode 12 comprises tungsten (W), molybdenum (Mo), copper (Cu), aluminum (Al), titanium (Ti), or tantalum (Ta). For example, the lower electrode 12 is a tungsten layer, a molybdenum layer, a copper layer, an aluminum layer, a titanium layer, or a tantalum layer.

The lower electrode 12 may have a stacked structure comprising a plurality of conductors. For example, the lower electrode 12 has a stacked structure with an oxide conductor layer and a metal layer. For example, a surface of the lower electrode 12 on a side facing the oxide semiconductor layer 16 is the oxide conductor layer.

The upper electrode 14 is provided on the oxide semiconductor layer 16. The upper electrode 14 is electrically connected to the oxide semiconductor layer 16. For example, the upper electrode 14 is in direct contact with the oxide semiconductor layer 16. The upper electrode 14 serves as a source electrode or a drain electrode of the transistor 100.

The upper electrode 14 is a conductor (conductive material). For example, the upper electrode 14 includes an oxide conductor (conductive oxide). For example, the upper electrode 14 comprises indium (In), tin (Sn), and oxygen (O). For example, the upper electrode 14 comprises indium tin oxide. For example, the upper electrode 14 is an indium tin oxide layer.

In some examples, the upper electrode 14 includes or comprises a metal. For example, the upper electrode 14 comprises tungsten (W), molybdenum (Mo), copper (Cu), aluminum (Al), titanium (Ti), or tantalum (Ta). For example, the upper electrode 14 is a tungsten layer, a molybdenum layer, a copper layer, an aluminum layer, a titanium layer, or a tantalum layer.

The upper electrode 14 may have a stacked structure comprising a plurality of conductors. For example, the upper electrode 14 has a stacked structure with an oxide conductor layer and a metal layer. For example, a surface of the upper electrode 14 on a side facing the oxide semiconductor layer 16 is the oxide conductor layer.

The lower electrode 12 and the upper electrode 14 can be formed of the same material. For example, the lower electrode 12 and the upper electrode 14 are oxide conductors including indium (In), tin (Sn), and oxygen (O). For example, the lower electrode 12 and the upper electrode 14 comprise indium tin oxide. For example, the lower electrode 12 and the upper electrode 14 are both indium tin oxide layers.

The oxide semiconductor layer 16 is provided between the lower electrode 12 and the upper electrode 14. For example, the oxide semiconductor layer 16 is in contact with the lower electrode 12 and the upper electrode 14.

The oxide semiconductor layer 16 includes a first region 16*a*, a second region 16*b*, and a third region 16*c*. The first region 16*a* is provided between the second region 16*b* and the third region 16*c* in the vertical direction.

A channel is formed in the oxide semiconductor layer 16 to serve as a current path in the on-operation (ON-state) of the transistor 100.

The oxide semiconductor layer 16 is an oxide semiconductor material. For example, the oxide semiconductor layer 16 is an amorphous material (non-crystalline).

In some examples, oxide semiconductor layer 16 includes with zinc (Zn) and oxygen (O) along with at least one element selected from the group consisting of indium (In), gallium (Ga), silicon (Si), aluminum (Al), and tin (Sn). For example, the oxide semiconductor layer 16 comprises indium (In), gallium (Ga), zinc (Zn) and oxygen (O). For example, the oxide semiconductor layer 16 comprises indium gallium zinc oxide. For example, the oxide semiconductor layer 16 is an indium gallium zinc oxide layer.

The oxide semiconductor layer 16 in some examples includes at least one element selected from the group consisting of titanium (Ti), zinc (Zn), and tungsten (W), and oxygen (O). For example, the oxide semiconductor layer 16 comprises titanium oxide, zinc oxide, or tungsten oxide. For example, the oxide semiconductor layer 16 is a titanium oxide layer, a zinc oxide layer, or a tungsten oxide layer.

In some examples, the oxide semiconductor layer 16 has a chemical composition different from the chemical composition of the lower electrode 12 and/or the chemical composition of the upper electrode 14.

The oxide semiconductor layer 16 includes oxygen vacancies. An oxygen vacancy in the oxide semiconductor layer 16 serves as donor.

For example, the length of the oxide semiconductor layer 16 in the vertical direction is 80 nm to 200 nm. For example, the width of the oxide semiconductor layer 16 in the horizontal direction is 20 nm to 100 nm.

The gate electrode 18 is opposed to (faces) a side surface of the oxide semiconductor layer 16. The gate electrode 18 is provided at a position along the vertical dimension of the oxide semiconductor layer 16 that is between the uppermost and lowermost ends of the oxide semiconductor layer (and between the lower electrode 12 and the upper electrode 14).

As shown in FIG. 2, the gate electrode 18 surrounds the oxide semiconductor layer 16 in a plane parallel to the second direction. The gate electrode 18 is provided around the circumference of the oxide semiconductor layer 16.

The gate electrode 18 is a conductor. For example, the gate electrode 18 is a metal, a metal compound, or a semiconductor material. For example, the gate electrode 18 comprises tungsten (W).

For example, the length of the gate electrode 18 in the first direction is 20 nm to 100 nm.

The gate insulating layer 20 is provided between the oxide semiconductor layer 16 and the gate electrode 18 in the second direction. The gate insulating layer 20 surrounds the oxide semiconductor layer 16. The gate insulating layer 20 is provided on the oxide semiconductor layer 16 for most of the length between the lower electrode 12 and the upper electrode 14 in the first direction.

The lowermost end of the gate insulating layer 20 is spaced apart (separated) from the lower electrode 12 in the first direction. In the present example, the uppermost end of the gate insulating layer 20 is in contact with the upper electrode 14.

For example, the gate insulating layer 20 is an oxide, a nitride, or an oxynitride. For example, the gate insulating layer 20 comprises silicon oxide, aluminum oxide, silicon nitride, aluminum nitride, or silicon oxynitride. For example, the gate insulating layer 20 is a silicon oxide layer, an aluminum oxide layer, a silicon nitride layer, an aluminum nitride layer, or a silicon oxynitride layer.

In some examples, the gate insulating layer 20 may have a stacked structure. For example, the gate insulating layer can be a stacked structure of a nitride layer and an oxide layer. For example, the gate insulating layer 20 is a stacked structure of a silicon nitride layer and a silicon oxide layer. For example, the thickness of the gate insulating layer 20 is 2 nm to 10 nm.

The lower insulating layer 22 is provided on the lower electrode 12. The lower insulating layer 22 is provided between the lower electrode 12 and the gate electrode 18.

As shown in FIG. 3, the lower insulating layer 22 surrounds the first region 16*a* of the oxide semiconductor layer 16. The lower insulating layer 22 also surrounds the gate insulating layer 20 in this region. The gate insulating layer is provided between the lower insulating layer 22 and the first region 16*a* of the oxide semiconductor layer 16 in the second direction.

The lower insulating layer 22 is an insulator. For example, the lower insulating layer 22 can be an oxide, a nitride, or an oxynitride. For example, the lower insulating layer 22 comprises silicon (Si) and oxygen (O). For example, the lower insulating layer 22 comprises silicon oxide. For example, the lower insulating layer 22 is a silicon oxide layer.

The protective insulating layer 24 is provided on an upper surface of the lower electrode 12. The protective insulating layer 24 is provided between the lower electrode 12 and the lower insulating layer 22 in the first direction.

As shown in FIG. 4, the protective insulating layer 24 surrounds the second region 16*b* of the oxide semiconductor layer 16. For example, the protective insulating layer 24 is in contact with the second region 16*b* of the oxide semiconductor layer 16.

The protective insulating layer 24 has a function of preventing the lower electrode 12 from being etched when a contact structure is being formed between the lower electrode 12 and the oxide semiconductor layer 16 in the manufacturing process of the transistor 100.

The protective insulating layer 24 is an insulator. For example, the protective insulating layer 24 is an oxide, a nitride, or an oxynitride.

The chemical composition of the protective insulating layer 24 can be different from the chemical composition of the lower insulating layer 22. In some examples, the density of the protective insulating layer 24 can be different from the density of the lower insulating layer 22. The chemical composition of the protective insulating layer 24 is different from the chemical compositions of the lower electrode 12 and the oxide semiconductor layer 16. The chemical composition of the protective insulating layer 24 can be different from the chemical composition of the gate insulating layer 20. In some examples, the density of the protective insulating layer 24 can be different from the density of the gate insulating layer 20.

For example, the protective insulating layer 24 is an amphoteric oxide. For example, the protective insulating layer 24 includes oxygen and at least one element selected from the group consisting of aluminum (Al), beryllium (Be), gallium (Ga), germanium (Ge), tin (Sn), lead (Pb), antimony (Sb), bismuth (Bi), zinc (Zn) and cadmium (Cd) For example, the protective insulating layer 24 comprises an oxide of at least one element selected from the group consisting of aluminum (Al), beryllium (Be), gallium (Ga), germanium (Ge), tin (Sn), lead (Pb), antimony (Sb), bismuth (Bi), zinc (Zn) and cadmium (Cd).

The oxide of the at least one selected element can be an amphoteric oxide. For example, the amphoteric oxide is soluble in both acidic solutions and alkaline solutions.

For example, the protective insulating layer 24 comprises aluminum oxide. For example, the protective insulating layer 24 is an aluminum oxide layer.

The protective insulating layer 24 can be a high-k dielectric insulator having a higher dielectric constant than silicon oxide. For example, the dielectric constant of the protective insulating layer 24 is higher than dielectric constant of the lower insulating layer 22.

In some examples, the protective insulating layer 24 comprises oxygen and at least one element selected from the group consisting of hafnium (Hf), zirconium (Zr), and yttrium (Y). For example, the protective insulating layer 24 comprises hafnium oxide, hafnium silicate, zirconium oxide, zirconium silicate, or yttrium oxide. The dielectric constants of hafnium oxide, hafnium silicate, zirconium oxide, zirconium silicate, and yttrium oxide are higher than the dielectric constant of silicon oxide. For example, the protective insulating layer 24 is a hafnium oxide layer, a hafnium silicate layer, a zirconium oxide layer, a zirconium silicate layer, or an yttrium oxide layer.

In some examples, the protective insulating layer 24 includes silicon (Si) and nitrogen (N). For example, the protective insulating layer 24 comprises silicon (Si), nitrogen (N), and oxygen (O). For example, the protective insulating layer 24 comprises silicon nitride or silicon oxynitride. For example, the protective insulating layer 24 is a silicon nitride layer or a silicon oxynitride layer.

When the lower insulating layer 22 comprises silicon oxide, the protective insulating layer 24 can comprise silicon oxide having a higher density than that of the silicon oxide in the lower insulating layer 22. When the lower insulating layer 22 is a silicon oxide layer, the protective insulating layer 24 can be a silicon oxide layer having a higher density than that of the silicon oxide layer of the lower insulating layer 22.

When the lower insulating layer 22 comprises silicon oxide, the protective insulating layer 24 comprises silicon oxide having a lower density than that of the silicon oxide in the lower insulating layer 22. When the lower insulating layer 22 is a silicon oxide layer, the protective insulating layer 24 can be a silicon oxide layer having a lower density than that of the silicon oxide layer of the lower insulating layer 22.

For example, the thickness of the protective insulating layer 24 in the first direction is less than that of the lower insulating layer 22 in the first direction. For example, the thickness of the protective insulating layer 24 in the first direction is 30% or less of that of the lower insulating layer 22 in the first direction.

The upper insulating layer 26 is provided on an upper surface of the gate electrode 18. For example, the upper insulating layer 26 is provided between the gate electrode 18 and the upper electrode 14 in the first direction.

The upper insulating layer 26 surrounds the third region 16*c* of the oxide semiconductor layer 16 in a plane parallel to the second direction. The upper insulating layer 26 also surrounds the gate insulating layer 20. The gate insulating layer is provided between the upper insulating layer 26 and the third region 16*c* of the oxide semiconductor layer 16 in the second direction.

The upper insulating layer 26 is an insulator. For example, the upper insulating layer 26 is an oxide, a nitride, or an oxynitride. For example, the upper insulating layer 26 comprises silicon (Si) and oxygen (O). For example, the upper insulating layer 26 comprises silicon oxide. For example, the upper insulating layer 26 is a silicon oxide layer.

A cross section which is parallel to the first direction and includes the oxide semiconductor layer 16, the lower insulating layer 22, the protective insulating layer 24, the upper insulating layer 26, and the gate insulating layer 20 is referred to as a first cross section. The cross section shown in FIG. 1 is an example of a first cross section.

In the first cross section, the lower insulating layer 22 includes a first portion 22*a* and a second portion 22*b*. The protective insulating layer 24 includes a third portion 24*a* and a fourth portion 24*b*. The gate insulating layer 20 includes a fifth portion 20*a*, a sixth portion 20*b*, a ninth portion 20*c*, and a tenth portion 20*d*. The upper insulating layer 26 includes a seventh portion 26*a* and an eighth portion 26*b*.

The oxide semiconductor layer 16 is provided between the first portion 22*a* and the second portion 22*b*. The oxide semiconductor layer 16 is also provided between the third portion 24*a* and the fourth portion 24*b*.

The fifth portion 20*a* is provided between the first portion 22*a* and the oxide semiconductor layer 16. The sixth portion 20*b* is provided between the second portion 22*b* and the oxide semiconductor layer 16.

The oxide semiconductor layer 16 is also provided between the seventh portion 26*a* and the eighth portion 26*b*. The ninth portion 20*c* is provided between the seventh portion 26*a* and the oxide semiconductor layer 16. The tenth portion 20*d* is provided between the eighth portion 26*b* and the oxide semiconductor layer 16.

For example, a first minimum distance (d1 in FIG. 1) between the third portion 24*a* and the fourth portion 24*b* is greater than a second minimum distance (d2 in FIG. 1) between the fifth portion 20*a* and the sixth portion 20*b*. The first minimum distance d1 can also be greater than a third minimum distance (d3 in FIG. 1) between the first portion 22*a* and the second portion 22*b*. In the present example, the first minimum distance d1 is greater than a maximum distance (d4 in FIG. 1) between the ninth portion 20*c* and the tenth portion 20*d*.

Next, an example of a method for manufacturing the semiconductor device according to the first embodiment will be described.

FIGS. 5, 6, 7, 8, 9, 10, 11, and 12 are schematic cross-sectional views showing examples of aspects of the method for manufacturing a semiconductor device according to the first embodiment. FIGS. 5 to 12 each show a cross section corresponding in position to FIG. 1. FIGS. 5 to 12 depict an example of the method for manufacturing the transistor 100.

In this described example, the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 is a silicon oxide layer, the lower insulating layer 22 is a silicon oxide layer, the protective insulating layer 24 is an aluminum oxide layer, and the upper insulating layer 26 is a silicon oxide layer.

Figure 5:
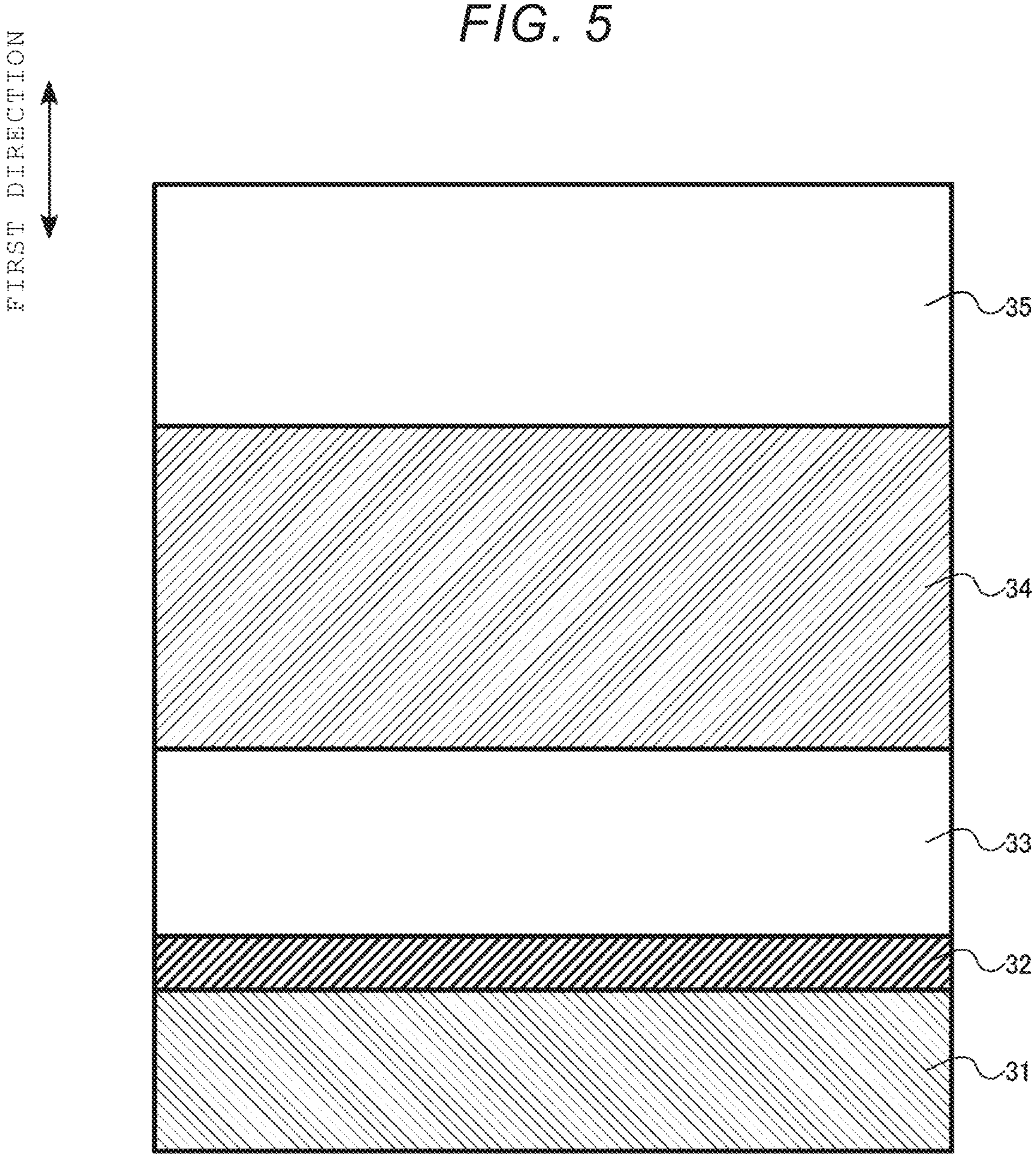
FIGS. 5 to 12 are schematic cross-sectional views depicting aspects of a method for manufacturing a semiconductor device according to a first embodiment.

First, a first indium tin oxide film 31, an aluminum oxide film 32, a first silicon oxide film 33, a tungsten film 34, and a second silicon oxide film 35 are stacked on a substrate or the like in the stated order along the first direction (see FIG. 5). For example, the first indium tin oxide film 31, the aluminum oxide film 32, the first silicon oxide film 33, the tungsten film 34, and the second silicon oxide film 35 are formed by a Chemical Vapor Deposition (CVD) method.

A portion of the first indium tin oxide film 31 eventually becomes the lower electrode 12. A portion of the aluminum oxide film 32 eventually becomes the protective insulating layer 24. A portion of the first silicon oxide film 33 eventually becomes the lower insulating layer 22. A portion of the tungsten film 34 eventually becomes the gate electrode 18. A portion of the second silicon oxide film 35 eventually becomes the upper insulating layer 26.

Figure 6:
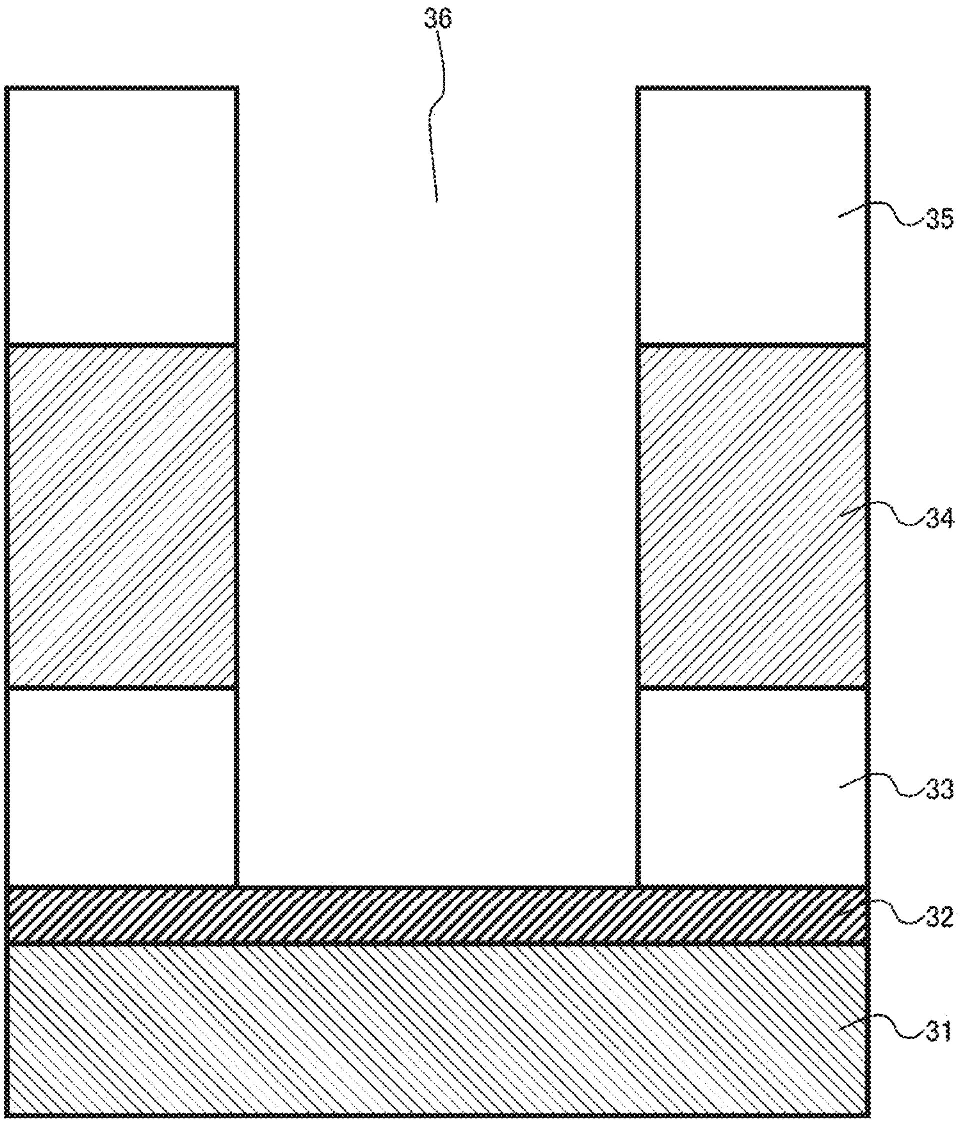

Next, an opening 36 is formed, extending from the surface of the second silicon oxide film 35 through the tungsten film 34 and the first silicon oxide film 33, and reaching the aluminum oxide film 32 (see FIG. 6). For example, the opening 36 is formed using a lithography method and a Reactive Ion Etching (RIE) method. The RIE method is an anisotropic etching that uses ion bombardment in a direction perpendicular to the substrate.

Figure 7:
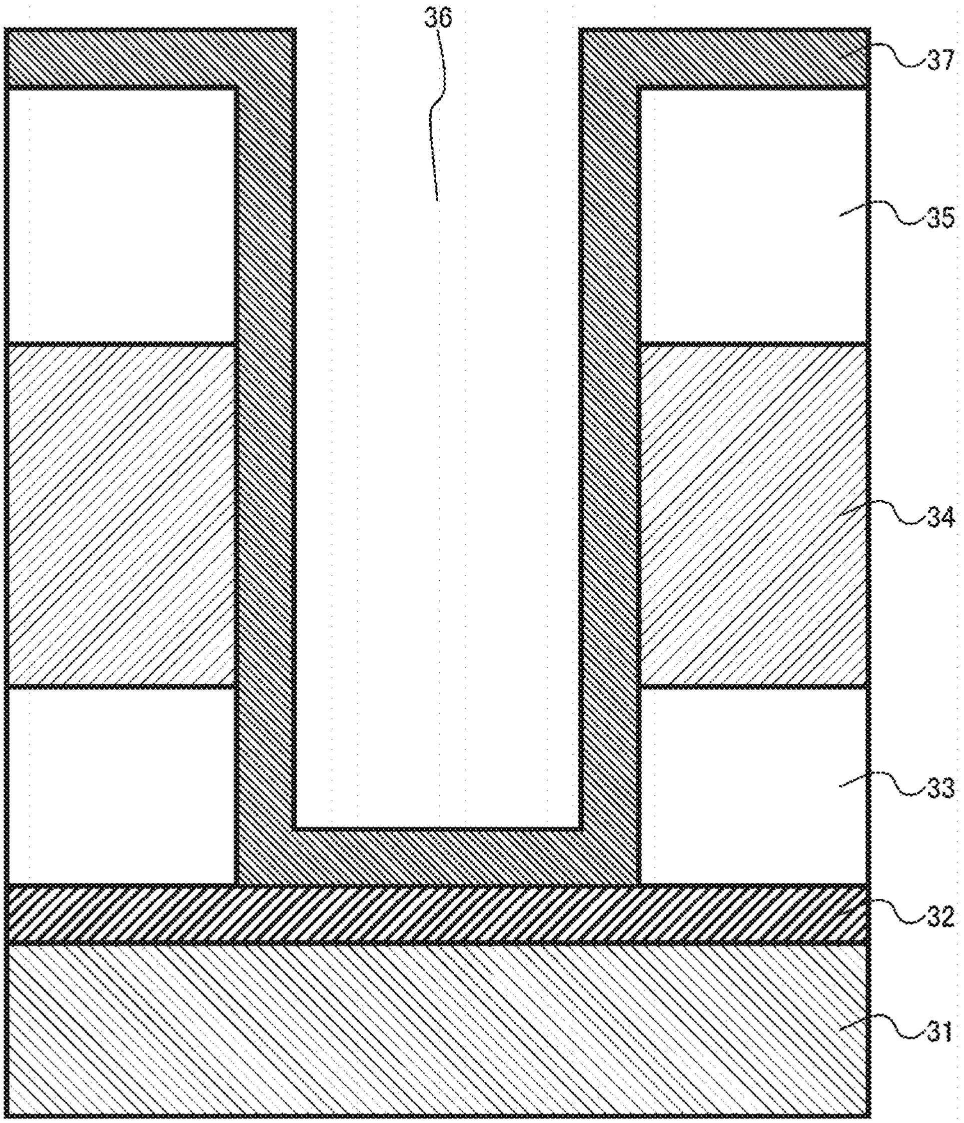

Next, a third silicon oxide film 37 is formed in the opening 36 (see FIG. 7). For example, the third silicon oxide film 37 is formed by a CVD method. A portion of the third silicon oxide film 37 eventually becomes the gate insulating layer 20.

Figure 8:
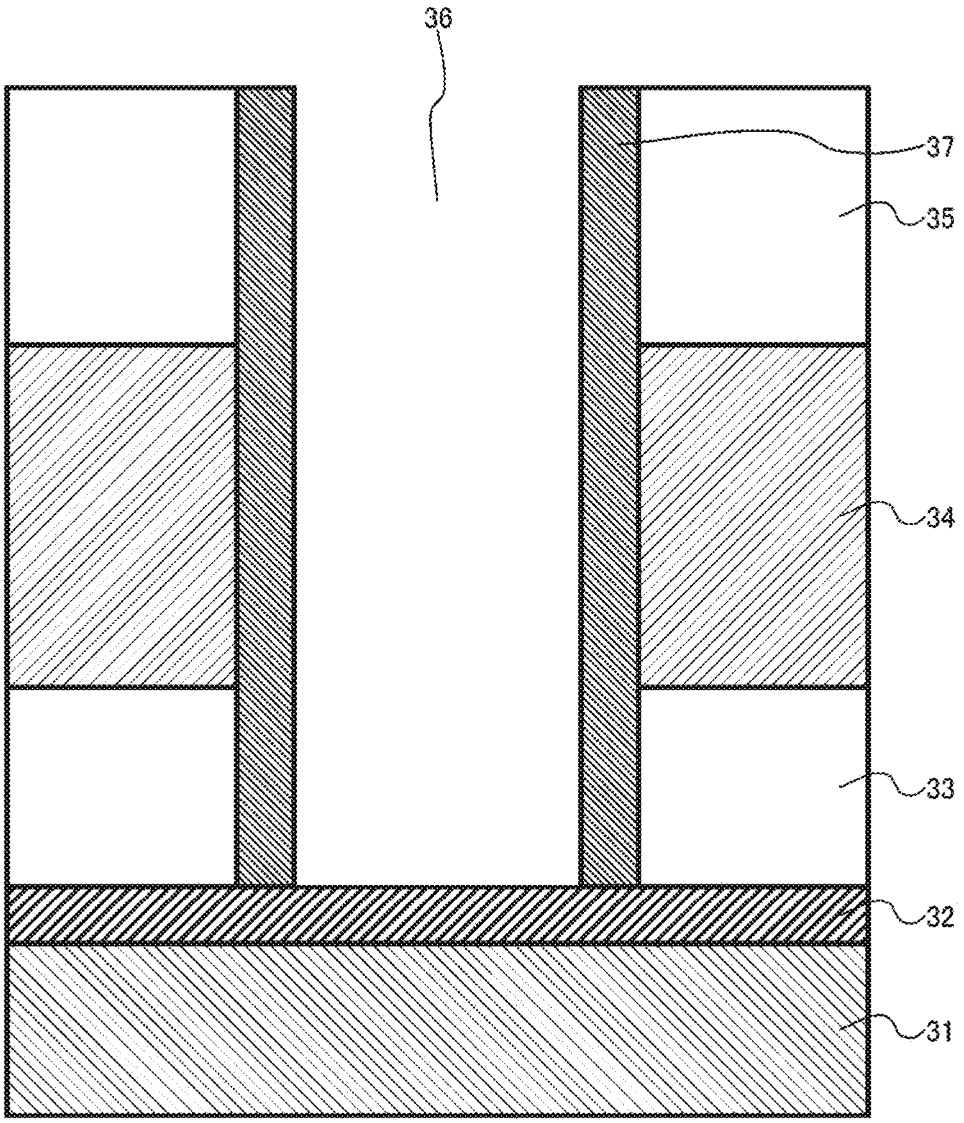

Next, the third silicon oxide film 37 on a bottom of the opening 36 is etched to expose the aluminum oxide film 32 (see FIG. 8). For example, the third silicon oxide film 37 is etched using an RIE method. When etching the third silicon oxide film 37, conditions are selected such that the etching rate of the aluminum oxide film 32 is slower (less) than the etching rate of the third silicon oxide film 37.

Figure 9:
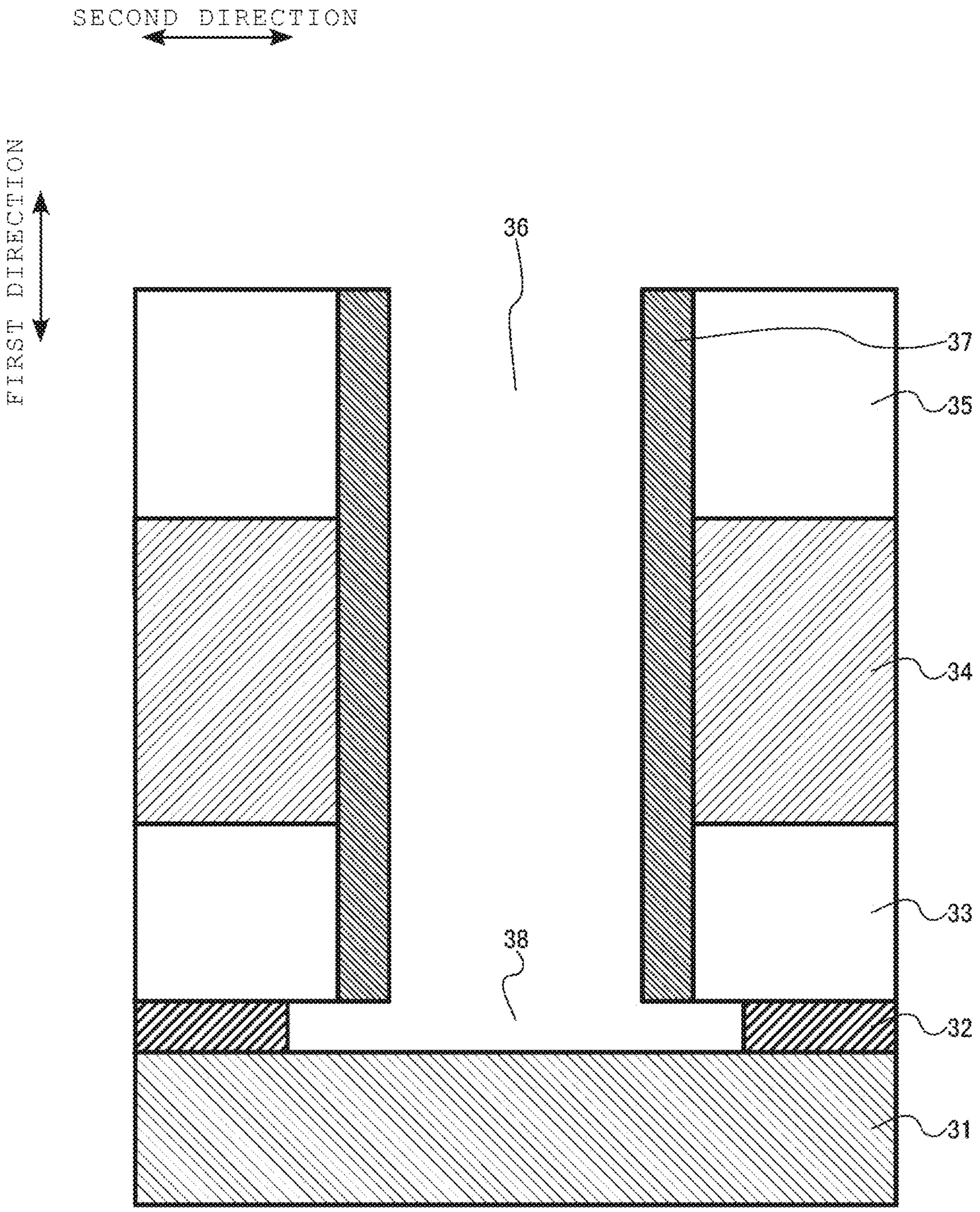

Next, the aluminum oxide film 32 exposed at the bottom of the opening 36 is etched to form a recess 38 extending in the second direction (see FIG. 9). The first indium tin oxide film 31 is exposed at the bottom of the recess 38.

For example, isotropic etching is performed for forming the recess 38. For example, when forming the recess 38, the aluminum oxide film 32 is isotropically etched. For example, conditions are selected such that, when forming the recess 38, the etching rates of the first indium tin oxide film 31, the first silicon oxide film 33, and the third silicon oxide film 37 are slower than the etching rate of the aluminum oxide film 32.

For example, a wet etching method is used for etching the aluminum oxide film 32 isotropically. For example, an alkaline solution is used for etching the aluminum oxide film 32. For example, choline is used for etching the aluminum oxide film 32. In some examples, an isotropic dry etching method can be used for etching the aluminum oxide film 32.

Figure 10:
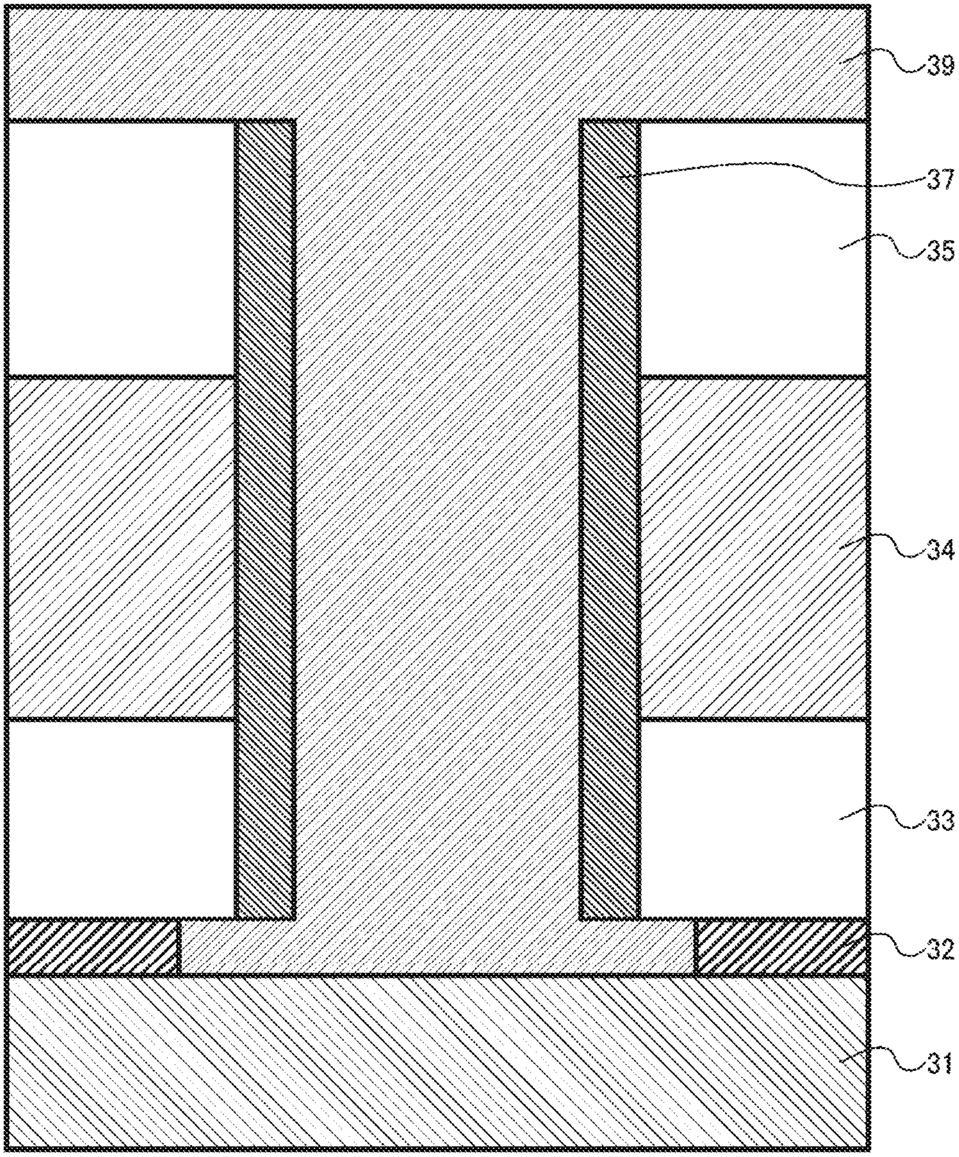

Next, the recess 38 and the opening 36 are filled with an indium gallium zinc oxide film 39 (see FIG. 10). A portion of the indium gallium zinc oxide film 39 eventually becomes the oxide semiconductor layer 16. For example, the indium gallium zinc oxide film 39 is formed by a CVD method.

Figure 11:
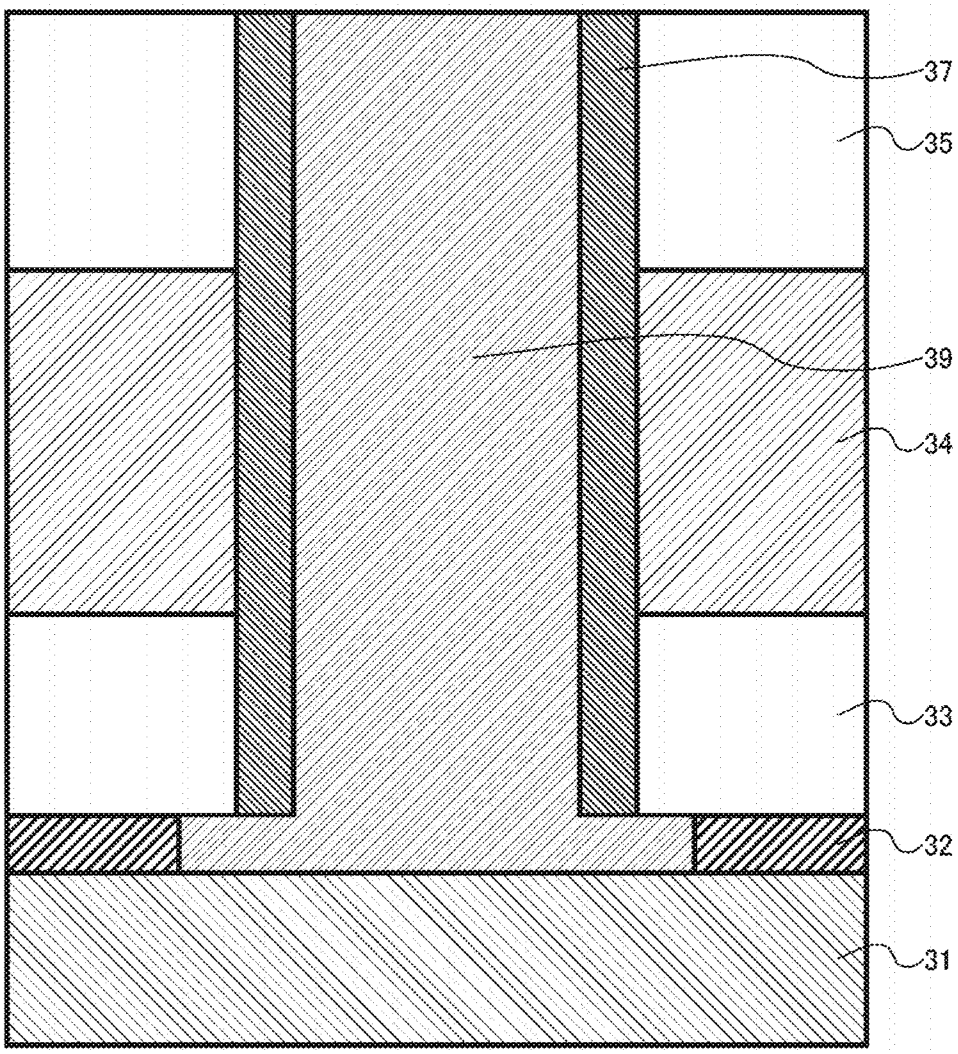

Next, an upper portion of the indium gallium zinc oxide film 39 is removed to expose an upper surface of the second silicon oxide film 35 (see FIG. 11). For example, the indium gallium zinc oxide film 39 is etched away using an RIE method.

Figure 12:
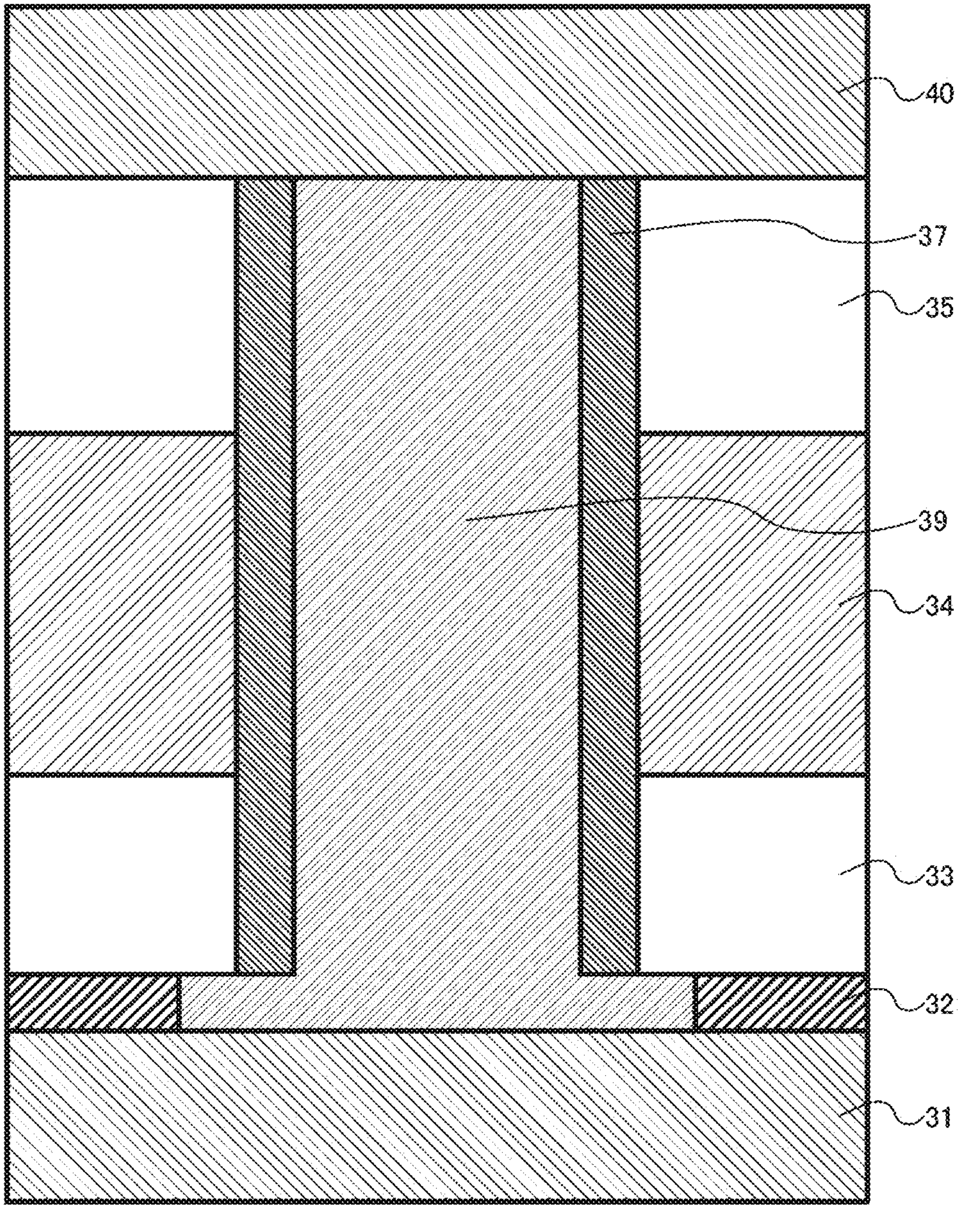

Next, a second indium tin oxide film 40 is formed (see FIG. 12). For example, the second indium tin oxide film 40 is formed by a CVD method. A portion of the second indium tin oxide film 40 eventually becomes the upper electrode 14.

According to the manufacturing method described above, the transistor 100 shown in FIGS. 1, 2, 3, and 4 is manufactured.

Next, operations and effects of the semiconductor device according to the first embodiment will be described.

Figure 13:
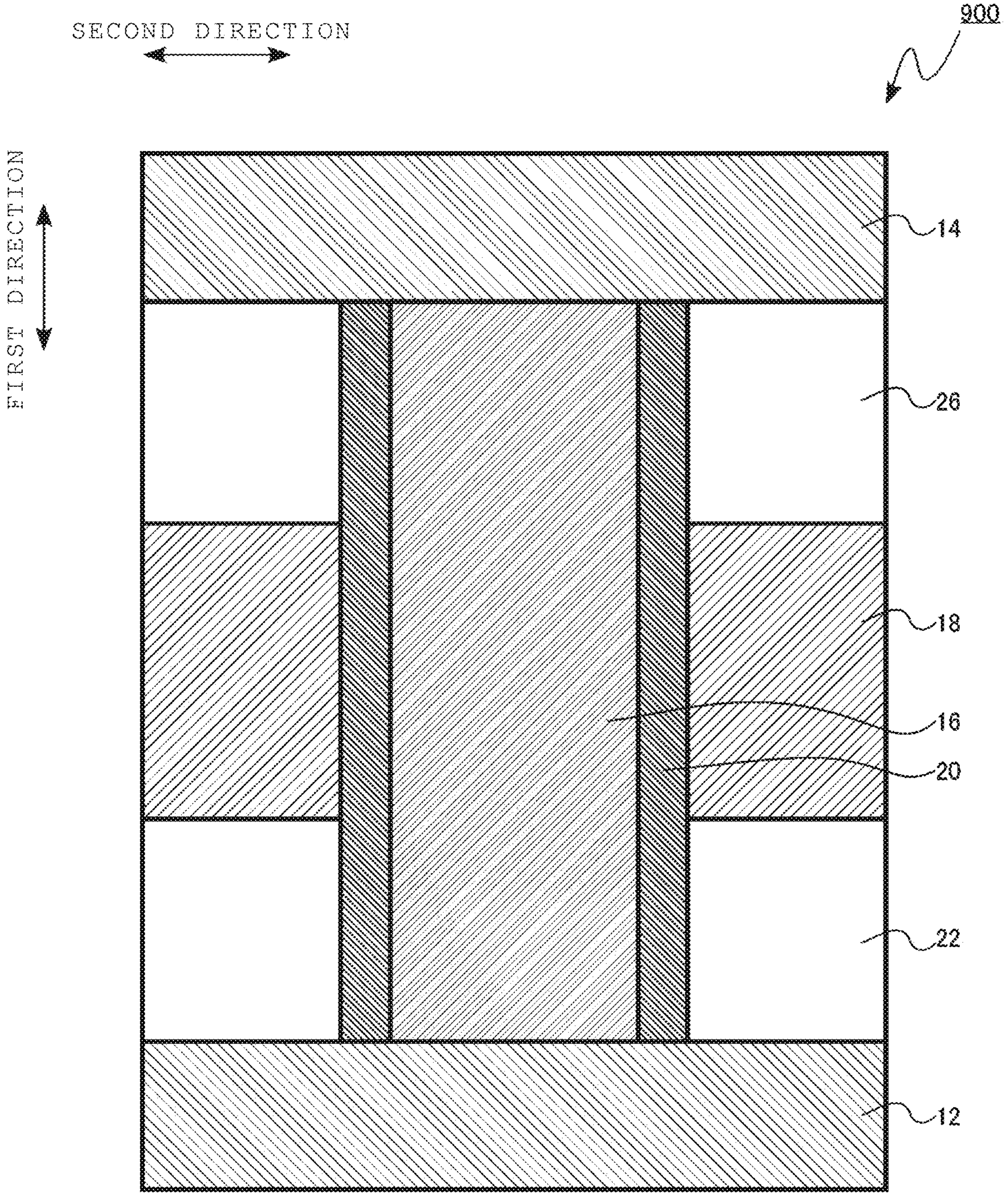
FIG. 13 is a schematic cross-sectional view showing a semiconductor device of a comparative example.

FIG. 13 is a schematic cross-sectional view of a semiconductor device of a comparative example. FIG. 13 is a view corresponding in general to FIG. 1.

The semiconductor device of a comparative example is a transistor 900. The transistor 900 of this comparative example is different from the transistor 100 of the first embodiment in that the protective insulating layer 24 is not provided and the lowermost end of the gate insulating layer 20 is in direct contact with the lower electrode 12.

FIGS. 14, 15, 16, 17, 18, 19, and 20 are schematic cross-sectional views depicting aspects of an example of a method for manufacturing the semiconductor device of the comparative example. FIGS. 14 to 20 respectively show cross sections corresponding in position to FIG. 13. FIGS. 14 to 20 are views depicting particularly an example of the method for manufacturing the transistor 900.

In the described comparative example, the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 is a silicon oxide layer, the lower insulating layer 22 is a silicon oxide layer, and the upper insulating layer 26 is a silicon oxide layer. These compositions are the same as in the description of the method for manufacturing transistor 100 in the first embodiment.

Figure 14:
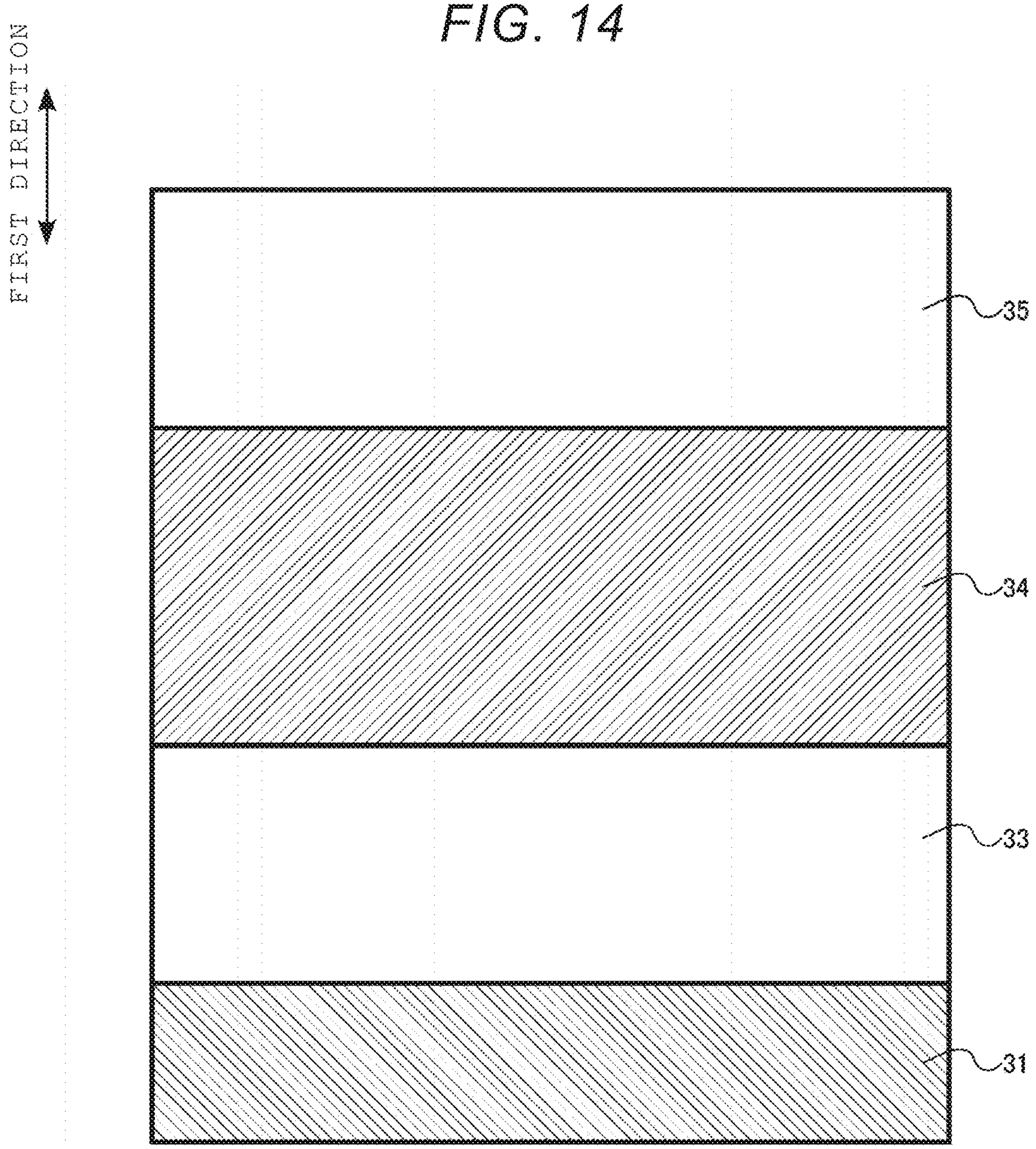
FIGS. 14 to 20 are schematic cross-sectional views depict aspects of a method for manufacturing a semiconductor device of a comparative example.

First, the first indium tin oxide film 31, the first silicon oxide film 33, the tungsten film 34, and the second silicon oxide film 35 are stacked on a substrate in the stated order along the first direction (see FIG. 14). For example, the first indium tin oxide film 31, the first silicon oxide film 33, the tungsten film 34, and the second silicon oxide film 35 are formed by a CVD method.

A portion of the first indium tin oxide film 31 eventually becomes the lower electrode 12. A portion of the first silicon oxide film 33 eventually becomes the lower insulating layer 22. A portion of the tungsten film 34 eventually becomes the gate electrode 18. A portion of the second silicon oxide film 35 eventually becomes the upper insulating layer 26.

Figure 15:
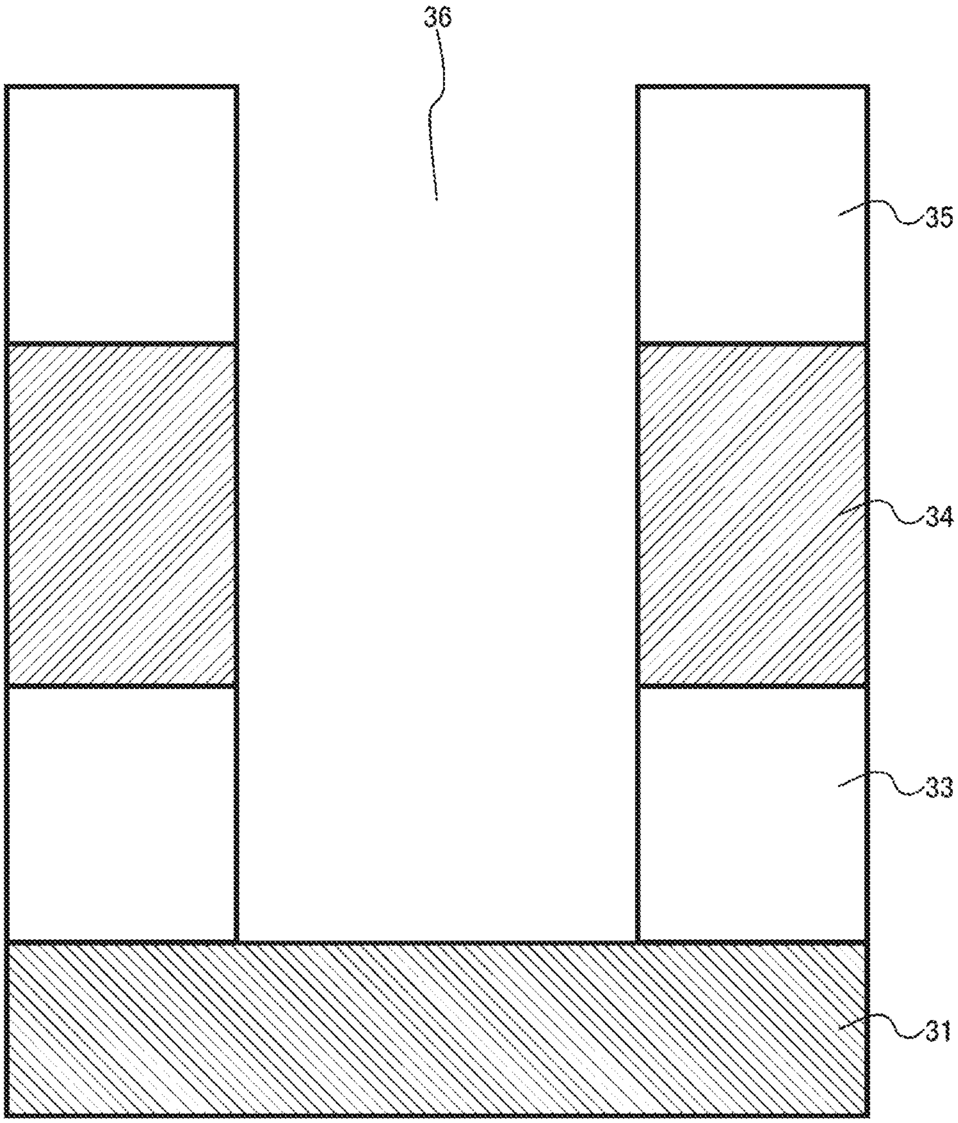

Next, an opening 36 is formed, extending from the surface of the second silicon oxide film 35 through the tungsten film 34 and the first silicon oxide film 33, and reaching the first indium tin oxide film 31 (see FIG. 15). For example, the opening 36 is formed using a lithography method and a RIE method.

Figure 16:
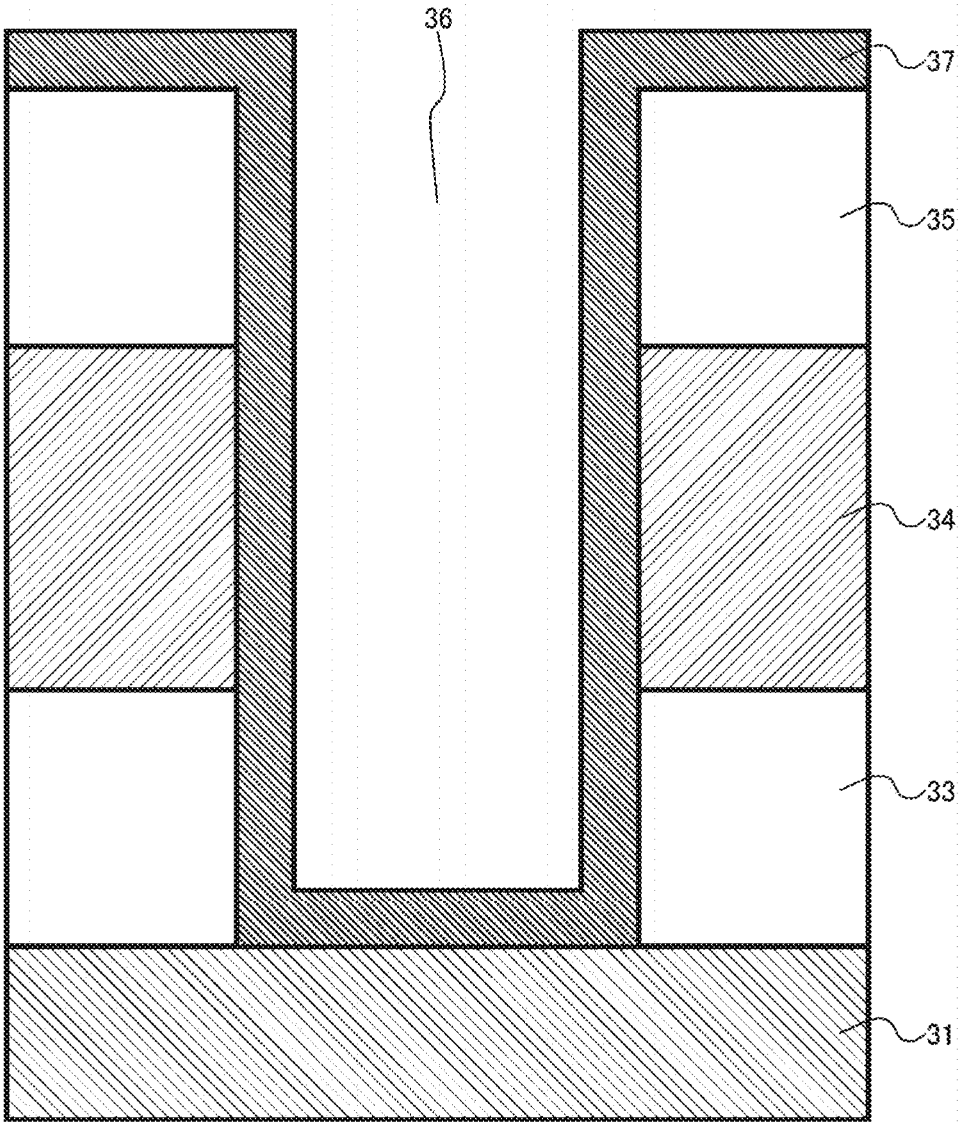

Next, the third silicon oxide film 37 is formed in the opening 36 (see FIG. 16). For example, the third silicon oxide film 37 is formed by a CVD method. A portion of the third silicon oxide film 37 eventually becomes the gate insulating layer 20.

Figure 17:
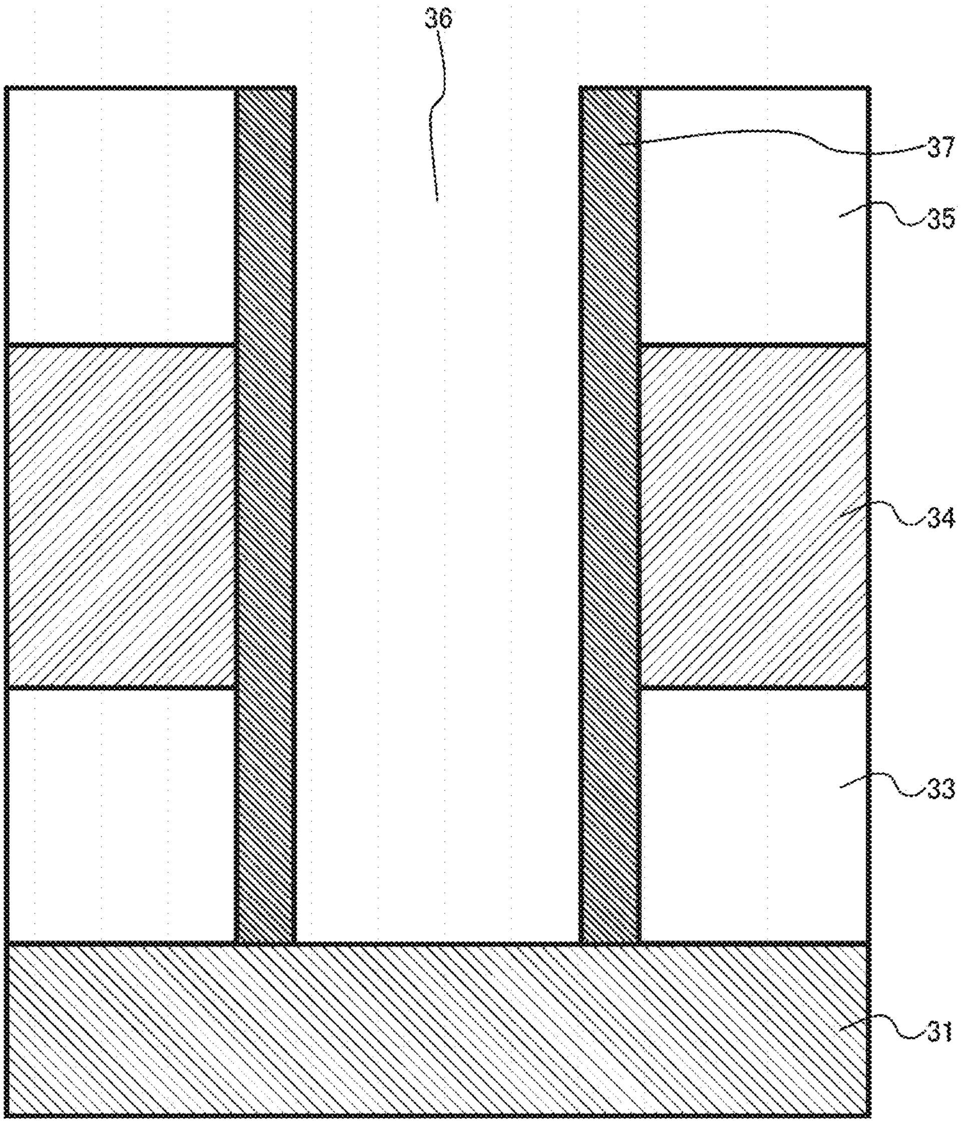

Next, the third silicon oxide film 37 at the bottom of the opening 36 is etched to expose the first indium tin oxide film 31 (see FIG. 17). For example, the third silicon oxide film 37 is etched using a RIE method.

Figure 18:
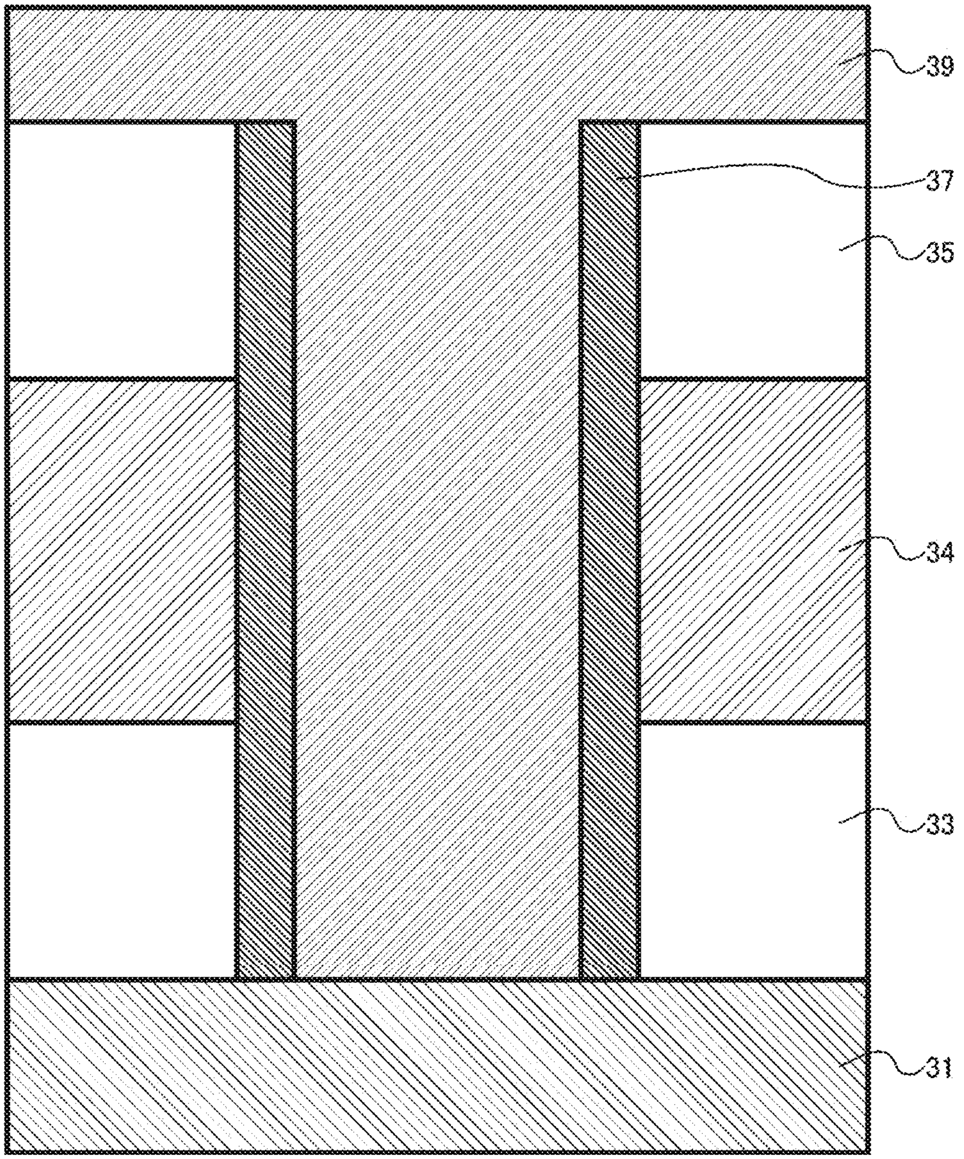

Next, the opening 36 is filled with an indium gallium zinc oxide film 39 (see FIG. 18). A portion of the indium gallium zinc oxide film 39 becomes the oxide semiconductor layer 16. For example, the indium gallium zinc oxide film 39 is formed by a CVD method.

Figure 19:
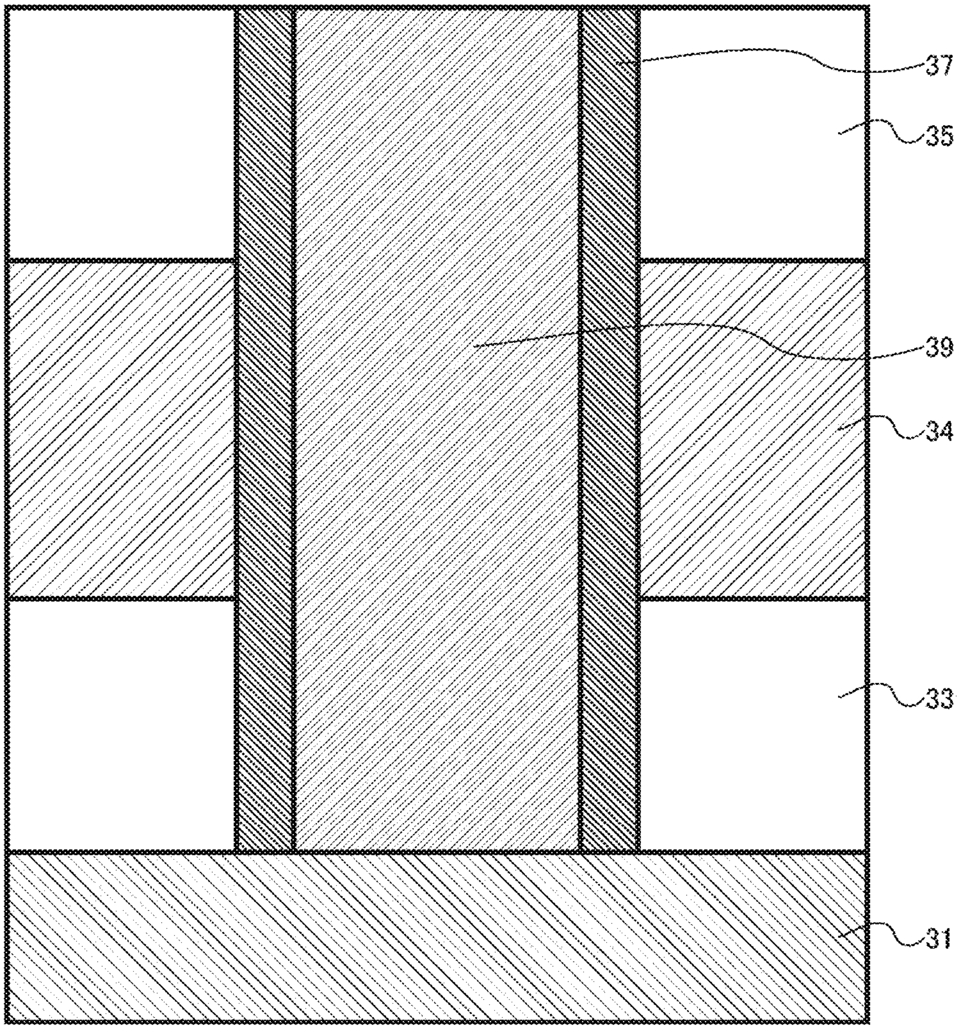

Next, an upper portion of the indium gallium zinc oxide film 39 is removed to expose an upper surface of the second silicon oxide film 35 (see FIG. 19). For example, the indium gallium zinc oxide film 39 is etched away using an RIE method.

Figure 20:
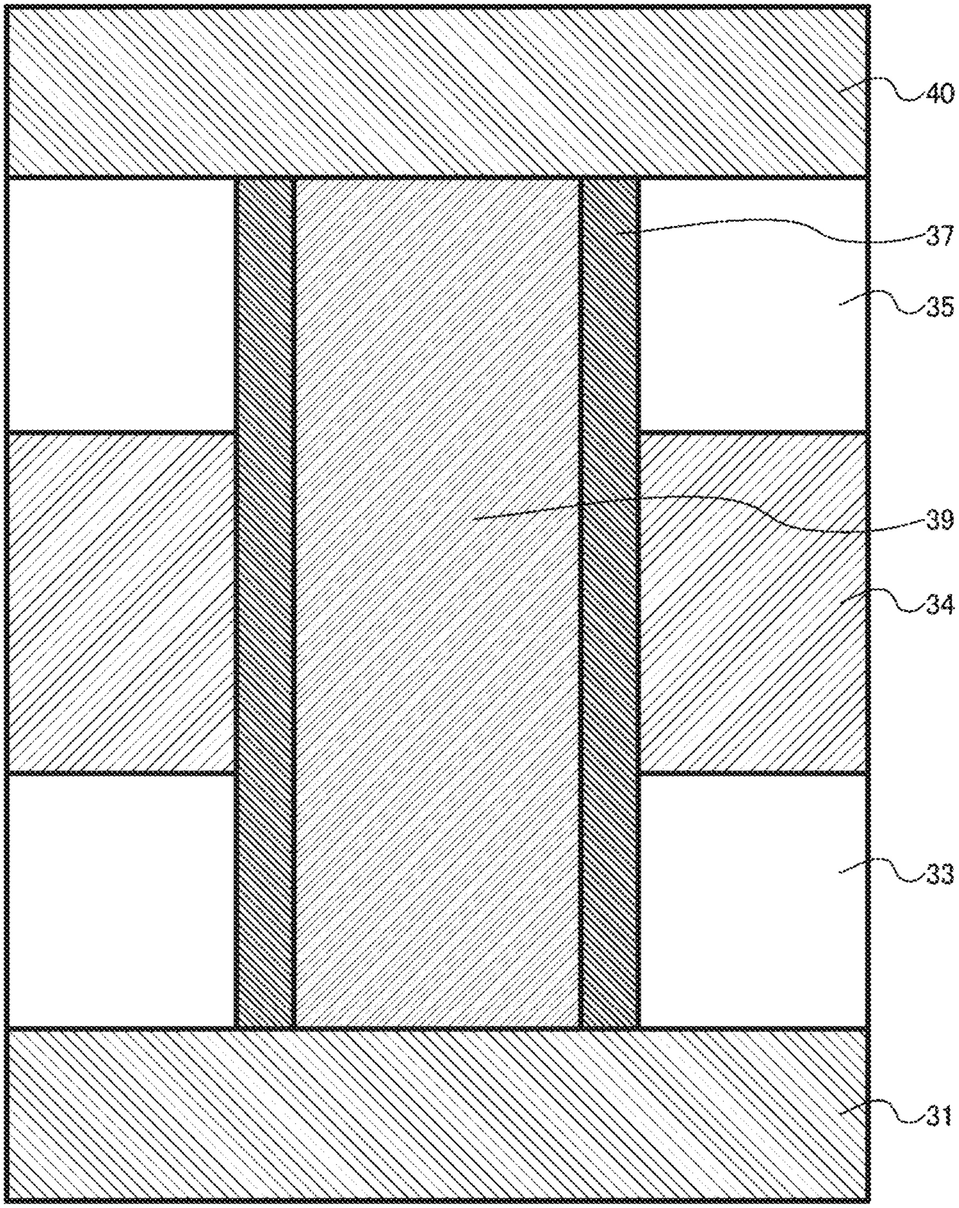

Next, a second indium tin oxide film 40 is formed (see FIG. 20). For example, the second indium tin oxide film 40 is formed by a CVD method. A portion of the second indium tin oxide film 40 eventually becomes the upper electrode 14.

According to this manufacturing method, the transistor 900 shown in FIG. 13 is manufactured.

In manufacturing the transistor 900 of this comparative example, a surface of the first indium tin oxide film 31 is exposed to etching when the opening 36 is being formed. For example, ion bombardment during the etching process causes damage to the exposed surface of the first indium tin oxide film 31. Furthermore, in manufacturing the transistor 900, when etching the third silicon oxide film 37 at the bottom of the opening 36, the surface of the first indium tin oxide film 31 is exposed to etching. Also in this case, ion bombardment or the like may cause damage to the exposed surface of the first indium tin oxide film 31.

Because the etching damage occurs at the surface of the first indium tin oxide film 31, the contact resistance between the first indium tin oxide film 31 and the indium gallium zinc oxide film 39 may be increased. In other words, the contact resistance between the lower electrode 12 and the oxide semiconductor layer 16 is increased. When the contact resistance between the lower electrode 12 and the oxide semiconductor layer 16 is increased, the on-resistance of the transistor 900 is increased undesirably.

Also, in manufacturing the transistor 900, when the third silicon oxide film 37 (which will later become the gate insulating layer 20) is being formed, the surface of the first indium tin oxide film 31 is initially exposed. Therefore, depending on the conditions used for forming the third silicon oxide film 37, the surface of the first indium tin oxide film 31 can be damaged. Therefore, the on-resistance of the transistor 900 may be increased undesirably.

However, transistor 100 according to the first embodiment includes the protective insulating layer 24. Therefore, when the opening 36 is being formed, the upper surface of the first indium tin oxide film 31 is kept from exposure to etching. Furthermore, when the third silicon oxide film 37 at the bottom of the opening 36 is being etched, the surface of the first indium tin oxide film 31 is also kept from exposure to etching. Therefore, etching damage to the surface of the first indium tin oxide film 31 does not occur.

Additionally, when the third silicon oxide film 37 (which will become the gate insulating layer 20) is being formed, the upper surface of the first indium tin oxide film 31 is still covered by the protective insulating layer 24. Therefore, damage that would otherwise accompany the formation of the third silicon oxide film 37 does not occur. Therefore, as compared to the transistor 900, the on-resistance of the transistor 100 is reduced.

Since the chemical composition or density of the protective insulating layer 24 is different from the chemical composition or density of the lower insulating layer 22, when the opening 36 is being formed, there will be a difference in etching rates between the film that will become the protective insulating layer 24 and the film that will become the lower insulating layer 22. Therefore, when the opening 36 is being formed, the upper surface of the first indium tin oxide film 31 can be prevented from being exposed.

In the manufacturing the transistor 100 of the first embodiment, when the aluminum oxide film 32 at the bottom of the opening 36 is etched, the surface of the first indium tin oxide film 31 is exposed to etching. However, by using isotropic etching, damage by ion bombardment is reduced, and it is possible to avoid substantial etching damage to the surface of the first indium tin oxide film 31.

The protective insulating layer 24 preferably comprises oxygen and at least one element selected from the group consisting of aluminum (Al), beryllium (Be), gallium (Ga), germanium (Ge), tin (Sn), lead (Pb), antimony (Sb), bismuth (Bi), zinc (Zn), and cadmium (Cd). The protective insulating layer 24 preferably comprises an oxide of at least one element selected from the group consisting of aluminum (Al), beryllium (Be), gallium (Ga), germanium (Ge), tin (Sn), lead (Pb), antimony (Sb), bismuth (Bi), zinc (Zn), and cadmium (Cd).

The oxide of the selected at least one element is an amphoteric oxide that is soluble in both the acidic solution and the alkaline solution. Therefore, for example, when the film (which will become the protective insulating layer 24) at the bottom of the opening 36 is etched by a wet etching method, it is easy to provide an etching rate different from the other relevant films.

The dielectric constant of the protective insulating layer 24 is preferably higher than the dielectric constant of the lower insulating layer 22. If the dielectric constant of the protective insulating layer 24 is higher than dielectric constant of the lower insulating layer 22, leakage current between the lower electrode 12 and the gate electrode 18 can be reduced.

The protective insulating layer 24 preferably comprises silicon nitride. If the protective insulating layer 24 comprises silicon nitride, it is easy to provide differences in etching rate between the film that will become the protective insulating layer 24 and the film that will eventually become the lower insulating layer 22, when the opening 36 is being formed. Further, when the film at the bottom of the opening 36, which will become the protective insulating layer 24, is etched by a wet etching method, it is easy to provide difference in etching rate from the other films.

In the transistor 100 of the first embodiment, the first minimum distance (d1 in FIG. 1) between the third portion 24*a* and the fourth portion 24*b* is greater than the second minimum distance (d2 in FIG. 1) between the fifth portion 20*a* and the sixth portion 20*b*. Therefore, compared to the transistor 900 of the comparative example, the contact area between the lower electrode 12 and the oxide semiconductor layer 16 is increased. Therefore, the contact resistance between the lower electrode 12 and the oxide semiconductor layer 16 is decreased. Thus, the on-resistance of the transistor 100 can be reduced.

From the viewpoint of increasing the contact area between the lower electrode 12 and the oxide semiconductor layer 16 and thus decreasing the contact resistance between the lower electrode 12 and the oxide semiconductor layer 16, the first minimum distance d1 is preferably greater than the third minimum distance (d3 in FIG. 1) between the first portion 22*a* and the second portion 22*b*. Furthermore, from the viewpoint of decreasing the contact resistance between the lower electrode 12 and the oxide semiconductor layer 16, the first minimum distance d1 is preferably greater than the maximum distance (d4 in FIG. 1) between the ninth portion 20*c* and the tenth portion 20*d*.

Modification

A semiconductor device according to a modification of the first embodiment is different in that the first minimum distance between the third and fourth portions is the same as the second minimum distance between the fifth and sixth portions.

Figure 21:
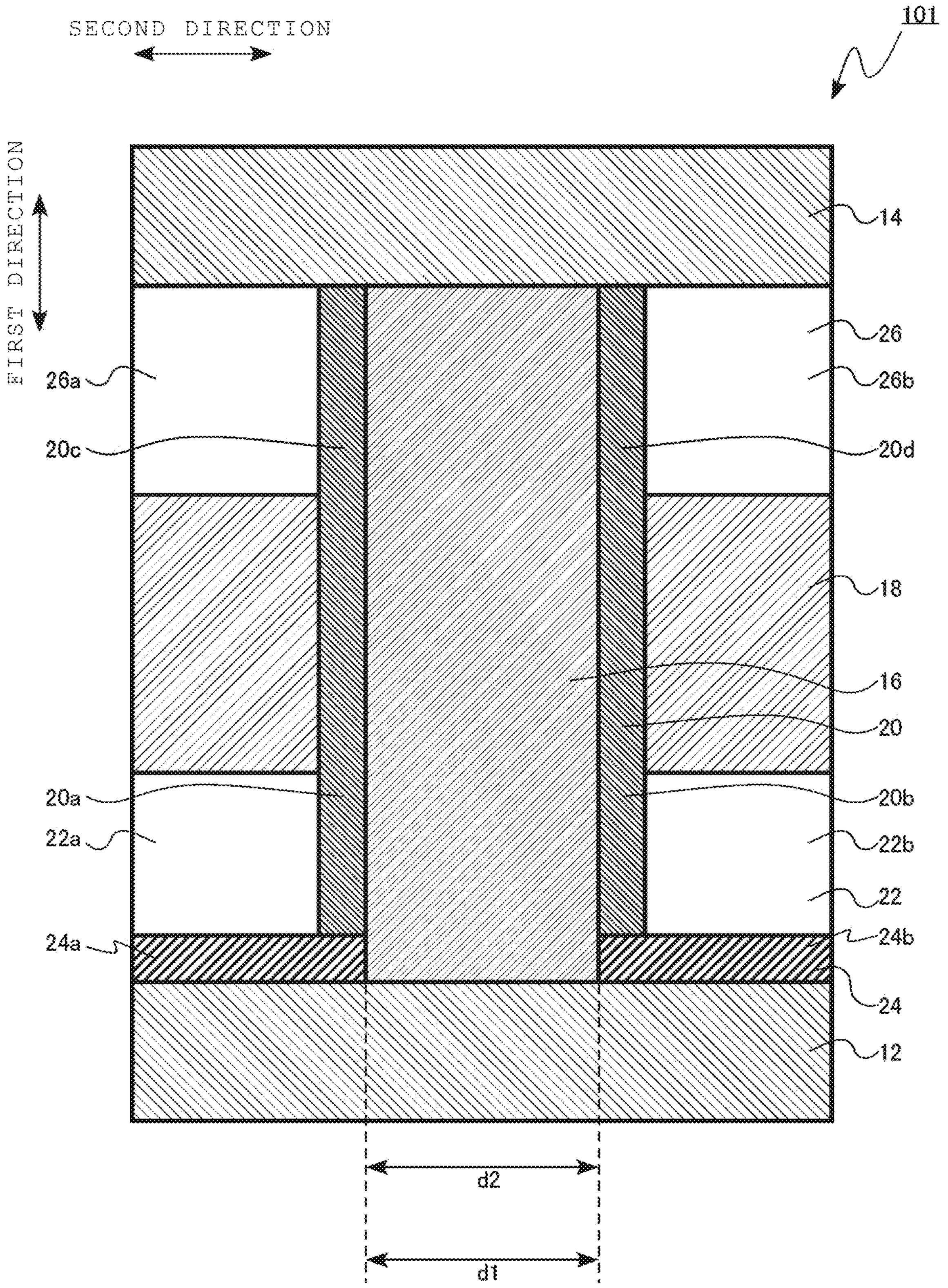
FIG. 21 is a schematic cross-sectional view showing a semiconductor device according to a modification of a first embodiment.

FIG. 21 is a schematic cross-sectional view of the semiconductor device according to this modification of the first embodiment. The semiconductor device according to this modification of the first embodiment is a transistor 101. FIG. 21 is a view corresponding in general to FIG. 1.

As shown in FIG. 21, the first minimum distance (d1 in FIG. 21) between the third portion 24*a* and the fourth portion 24*b* is the same as the second minimum distance (d2 in FIG. 21) between the fifth portion 20*a* and the sixth portion 20*b*.

Since the transistor 101 also includes the protective insulating layer 24 the on-resistance can be reduced in a manner similar to the transistor 100.

As described above, according to the first embodiment and the modification, the semiconductor device with reduced on-resistance and excellent transistor characteristics can be obtained.

Second Embodiment

A semiconductor device according to the second embodiment is different from the semiconductor device according to the first embodiment in that the second minimum distance (d2) between the fifth portion 20*a* and the sixth portion 20*b* is less than the maximum distance (d4) between the ninth portion 20*c* and the tenth portion 20*d*. The second embodiment is otherwise similar to the first embodiment.

Figure 22:
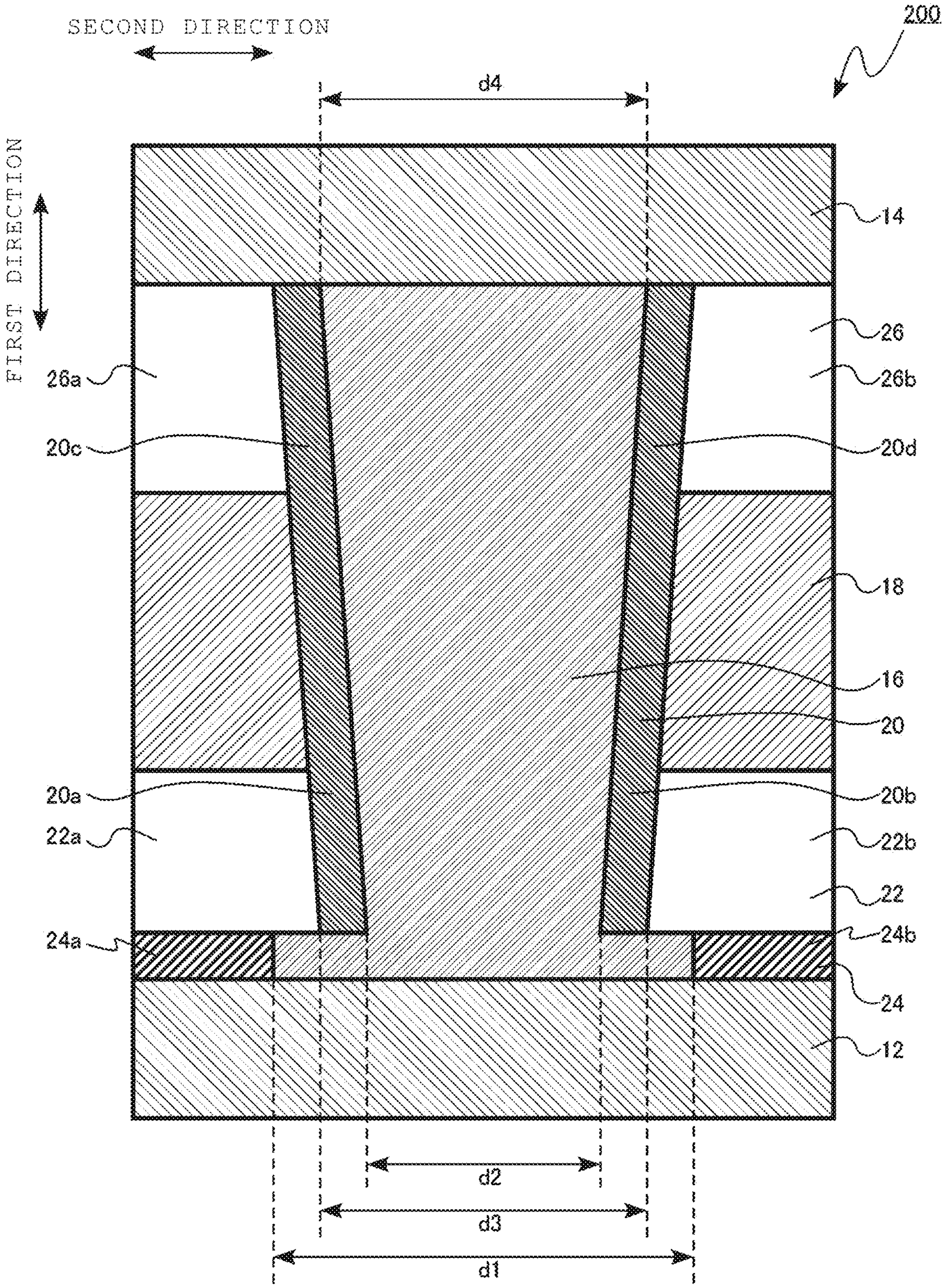
FIG. 22 is a schematic cross-sectional view showing a semiconductor device according to a second embodiment.

FIG. 22 is a schematic cross-sectional view showing a semiconductor device according to the second embodiment. The semiconductor device according to the second embodiment is a transistor 200.

The transistor 200 is an oxide semiconductor transistor in which a channel is formed in an oxide semiconductor. The transistor 200 is provided with a gate electrode 18 surrounding an oxide semiconductor layer 16 in which the channel is formed. The transistor 200 is a so-called SGT. The transistor 200 is also a so-called vertical transistor.

The transistor 200 includes a lower electrode 12, an upper electrode 14, an oxide semiconductor layer 16, a gate electrode 18, a gate insulating layer 20, a lower insulating layer 22, a protective insulating layer 24 and an upper insulating layer 26. The lower insulating layer 22 includes the first portion 22a and the second portion 22b. The protective insulating layer 24 includes the third portion 24a and the fourth portion 24b. The gate insulating layer 20 includes the fifth portion 20a, the sixth portion 20b, the ninth portion 20c and the tenth portion 20d. The upper insulating layer 26 includes the seventh portion 26a and the eighth portion 26b.

The lower electrode 12 is an example of a first electrode. The upper electrode 14 is an example of a second electrode. The lower insulating layer 22 is an example of a first insulating layer. The protective insulating layer 24 is an example of a second insulating layer. The upper insulating layer 26 is an example of a third insulating layer.

The second minimum distance (d2 in FIG. 22) between the fifth portion 20a and the sixth portion 20b is less than the maximum distance (d4 in FIG. 22) between the ninth portion 20c and the tenth portion 20d. In a first cross section parallel to the first direction, a side surface of the oxide semiconductor layer 16 has a forward tapered shape.

For example, the first minimum distance (d1 in FIG. 22) between the third portion 24a and the fourth portion 24b is greater than the second minimum distance (d2 in FIG. 22) between the fifth portion 20a and the sixth portion 20b. The first minimum distance d1 is greater than the third minimum distance (d3 in FIG. 22) between the first portion 22a and the second portion 22b. The first minimum distance d1 is also greater than the maximum distance (d4 in FIG. 22) between the ninth portion and the tenth portion 20d.

Since the transistor 200 according to the second embodiment includes the protective insulating layer 24, the on-resistance can be reduced as in the transistor 100 of the first embodiment.

Modification

A semiconductor device according to a modification of the second embodiment is different in that a fourth insulating layer surrounded by the oxide semiconductor layer 16 is further included.

Figure 23:
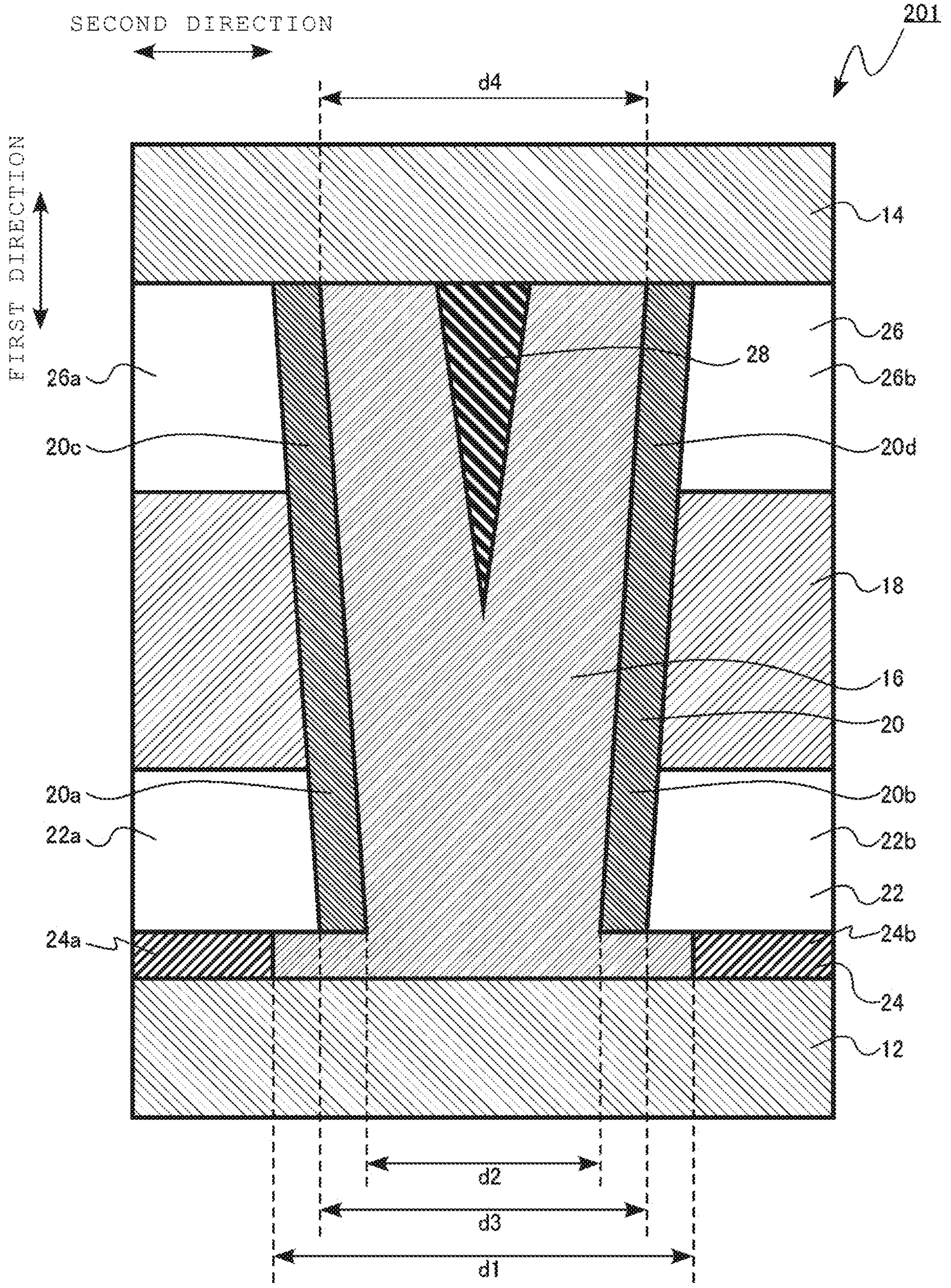
FIG. 23 is a schematic cross-sectional view showing a semiconductor device according to a modification of a second embodiment.

FIG. 23 is a schematic cross-sectional view showing a semiconductor device according to this modification of the second embodiment. The semiconductor device according to the modification of the second embodiment is a transistor 201. FIG. 23 is a view corresponding in general to FIG. 22.

The transistor 201 includes a core insulating layer 28. The core insulating layer 28 is an example of a fourth insulating layer.

In a cross-section perpendicular to the first direction, the core insulating layer 28 is surrounded by the oxide semiconductor layer 16. For example, the core insulating layer 28 includes an upper insulating layer 26 and is surrounded by the oxide semiconductor layer 16, in a cross section perpendicular to the first direction.

The core insulating layer 28 extends in the first direction. For example, the core insulating layer 28 is in contact with the upper electrode 14.

The core insulating layer 28 is an insulator. For example, the core insulating layer 28 is an oxide, a nitride, or an oxynitride. For example, the core insulating layer 28 comprises silicon (Si) and oxygen (O). For example, the core insulating layer 28 comprises silicon oxide. For example, the core insulating layer 28 is a silicon oxide layer.

Since the transistor 201 according to the modification of the second embodiment also includes the protective insulating layer 24, the on-resistance can be reduced in a manner similar to the transistor 200.

As described above, according to the second embodiment and the modification, the semiconductor device with reduced on-resistance and excellent transistor characteristics can be implemented.

Third Embodiment

A semiconductor storage device according to a third embodiment comprises the semiconductor device according to the first embodiment along with a capacitor electrically connected to the first electrode or the second electrode.

The semiconductor storage device according to the third embodiment is a semiconductor memory 300. The semiconductor storage device according to the third embodiment is DRAM. The semiconductor memory 300 uses the transistor 100 of the first embodiment as a switching transistor of a DRAM memory cell.

Figure 24:
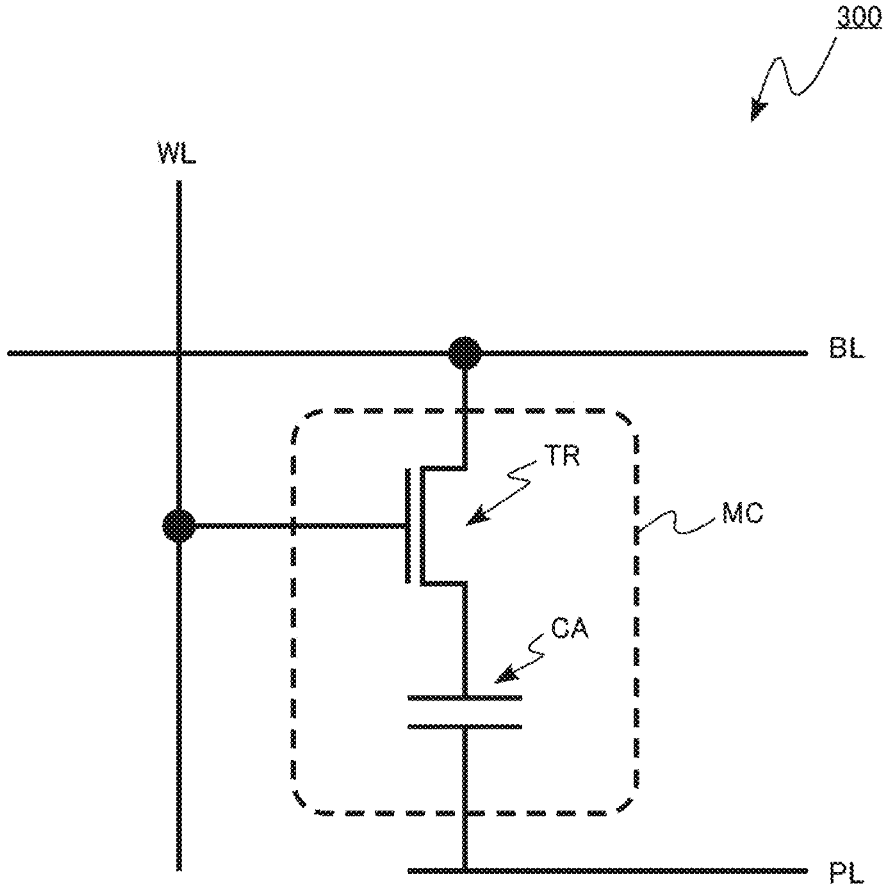
FIG. 24 is an equivalent circuit diagram of a semiconductor storage device according to a third embodiment.

FIG. 24 is an equivalent circuit diagram of the semiconductor storage device according to the third embodiment. Although FIG. 24 illustrates an example in which there is one memory cell MC, in general a plurality of such memory cells MC would be provided in an array or the like.

The semiconductor memory 300 includes a memory cell MC, a word line WL, a bit line BL, and a plate line PL. The memory cell MC includes a switching transistor TR and a capacitor CA. In FIG. 24, the region surrounded by a dotted line is the memory cell MC.

The word line WL is electrically connected to the gate electrode of the switching transistor TR. The bit line BL is electrically connected to one of the source or the drain electrodes of the switching transistor TR. One electrode of the capacitor CA is electrically connected to the other of the source and drain electrodes of the switching transistor TR. The other electrode of the capacitor CA is connected to the plate line PL.

The memory cell MC stores data by accumulating charges in the capacitor CA. Data writing and reading are performed by turning the switching transistor TR on (on-state).

For example, by turning on the switching transistor TR while applying a desired voltage to the bit line BL, data is written to the memory cell MC.

By turning on the switching transistor TR, change in the voltage of the bit line BL corresponding to the charge amount accumulated in the capacitor is detected and the data of the memory cell MC can be read.

Figure 25:
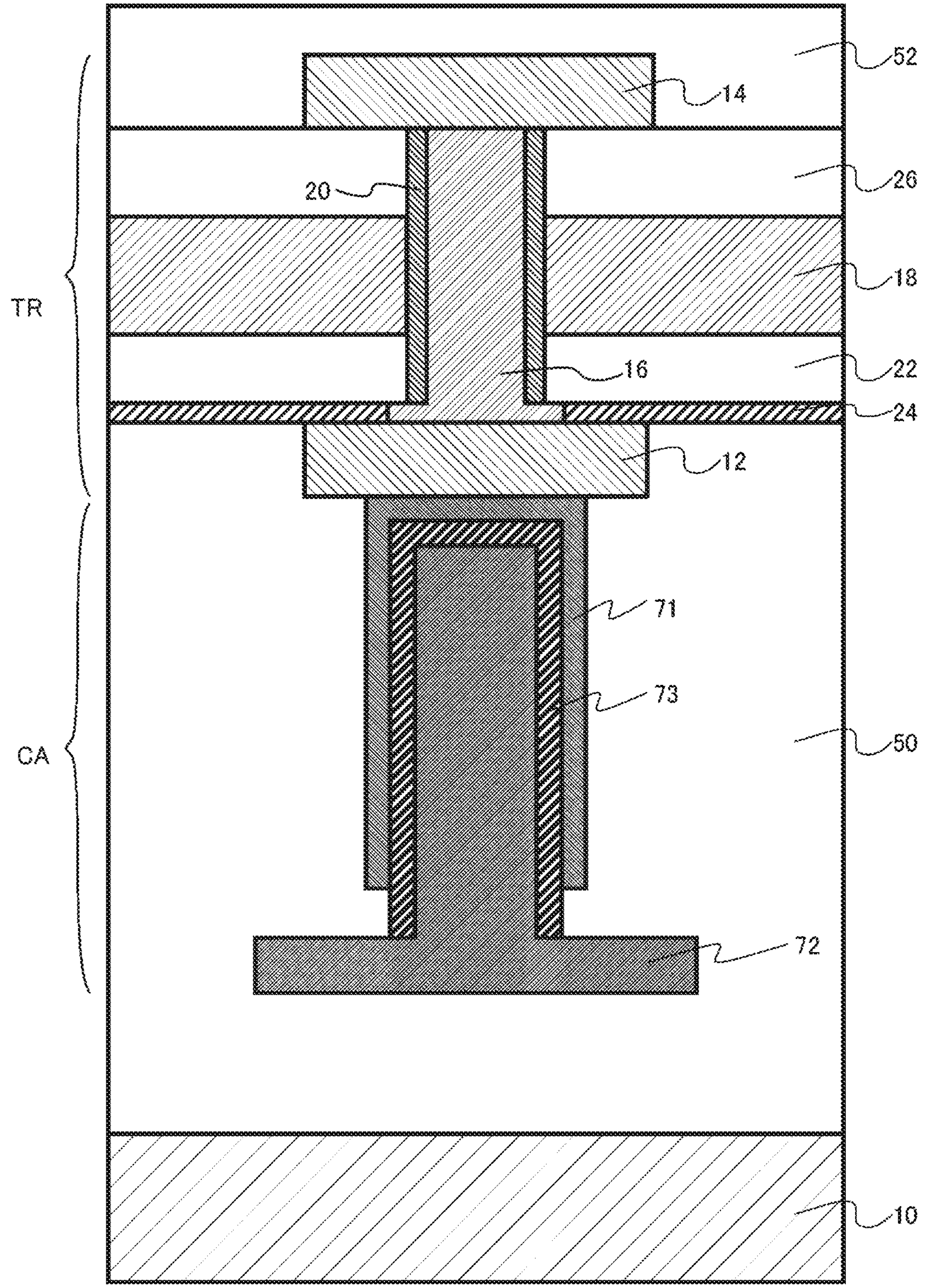
FIG. 25 is a schematic cross-sectional view showing a semiconductor storage device according to a third embodiment.

FIG. 25 is a schematic cross-sectional view of the semiconductor storage device according to the third embodiment. FIG. 25 shows a cross section of the memory cell MC of the semiconductor memory 300.

The semiconductor memory 300 includes silicon substrate 10, switching transistor TR, capacitor CA, a first interlayer insulating layer 50 and a second interlayer insulating layer 52.

The switching transistor TR includes a lower electrode 12, an upper electrode 14, an oxide semiconductor layer 16, a gate electrode 18, a gate insulating layer 20, a lower insulating layer 22, a protective insulating layer 24 and an upper insulating layer 26.

The switching transistor TR has the same structure as that of the transistor 100 according to the first embodiment.

The capacitor CA is provided between the silicon substrate 10 and the switching transistor TR. The capacitor CA is provided between the silicon substrate 10 and the lower electrode 12. The capacitor CA is electrically connected to the lower electrode 12.

The capacitor CA includes a cell electrode 71, a plate electrode 72 and a capacitor insulating film 73. The cell electrode 71 is electrically connected to the lower electrode 12. For example, the cell electrode 71 is in contact with the lower electrode 12.

For example, the cell electrode 71 and the plate electrode 72 are titanium nitride. For example, the capacitor insulating film 73 is a stacked structure of zirconium oxide, aluminum oxide, and zirconium oxide.

For example, the gate electrode 18 is electrically connected to a word line WL. For example, the upper electrode 14 is electrically connected to a bit line BL. For example, the plate electrode 72 is connected to a plate line PL.

The semiconductor memory 300 incorporates an oxide semiconductor transistor (e.g., a transistor 100) with a very small channel leakage current in off-operation as the switching transistor TR. Therefore, DRAM with excellent charge storing characteristics can be obtained.

The switching transistor TR of the semiconductor memory 300 has a low on-resistance. Therefore, the memory cell MC can have an increased writing or reading speed. Thus, operating characteristics of the semiconductor memory 300 can be improved.

The third embodiment is described above by referring to an example of the semiconductor memory using the transistor according to the first embodiment, but the semiconductor memory according to an embodiment of the disclosure may also or instead use the transistor 200 (or transistor 201) according to the second embodiment and its modifications.

The third embodiment describes a semiconductor memory in which the cell electrode is electrically connected to the lower electrode 12, but a semiconductor memory according to an embodiment of the present disclosure may be a semiconductor memory in which the cell electrode is instead electrically connected to the upper electrode 14.

In one example structure, the capacitor CA may be provided on the switching transistor TR. In another example structure, the switching transistor TR may be provided between the silicon substrate 10 and the capacitor CA.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
- a first electrode;
- a second electrode;
- an oxide semiconductor layer between the first electrode and the second electrode;
- a gate electrode surrounding the oxide semiconductor layer;
- a gate insulating layer between the gate electrode and the oxide semiconductor layer, the gate insulating layer being separated from the first electrode;
- a first insulating layer between the first electrode and the gate electrode, the gate insulating layer being between first insulating layer and the oxide semiconductor layer; and
- a second insulating layer between the first electrode and the first insulating layer, the second insulating layer being different in chemical composition from chemical composition of the first insulating layer, wherein
- the oxide semiconductor layer directly contacts both the second insulating layer and the first electrode,
- the gate insulating layer directly contacts both the oxide semiconductor layer and the gate electrode; and
- the gate insulating layer is in direct contact with the second electrode.

2. The semiconductor device of claim 1, wherein
- the first insulating layer surrounds a first region of the oxide semiconductor layer,
- the second insulating layer surrounds a second region of the oxide semiconductor layer, and
- the second region of the oxide semiconductor layer is in direct contact with a surface of the first electrode.

3. The semiconductor device of claim 2, wherein a width of the second region of the oxide semiconductor layer in a direction parallel to the surface of the first electrode is greater than a width of the first region of the oxide semiconductor layer in the direction parallel to the surface of the first electrode.

4. The semiconductor device of claim 3, wherein the width of the second region is greater than a width of a third region of the oxide semiconductor layer in the direction parallel to the surface of the first electrode, the third region of the oxide semiconductor layer being in direct contract with the second electrode.

5. The semiconductor device of claim 4, further comprising:
- a third insulating layer between the second electrode and the gate electrode, wherein
- the third region of the oxide semiconductor layer is surrounded by the third insulating layer.

6. The semiconductor device of claim 4, wherein the width of the third region is less than the width of the second region.

7. The semiconductor device of claim 4, wherein the width of the third region is substantially equal to the width of the first region.

8. The semiconductor device of claim 4, wherein the width of the third region is greater than the width of the first region.

9. The semiconductor device of claim 8, wherein a width of the oxide semiconductor layer in the direction parallel to the surface of the first electrode gradually narrows from the third region to the first region.

10. The semiconductor device of claim 4, further comprising:
- a core insulating layer inside the third region of the oxide semiconductor layer.

11. The semiconductor device of claim 1, wherein a thickness of the second insulating layer between the first electrode and the first insulating layer is less than a thickness of the first insulating layer between the second insulating layer and the gate electrode.

12. The semiconductor device of claim 1, wherein the first electrode comprises indium, tin, and oxygen.

13. The semiconductor device of claim 1, wherein the second insulating layer comprises oxygen and at least one element selected from the group consisting of aluminum, beryllium, gallium, germanium, tin, lead, antimony, bismuth, zinc, and cadmium.

14. The semiconductor device of claim 1, wherein
- the second insulating layer comprises silicon and nitrogen, and
- the first insulating layer comprises silicon and oxygen.

15. The semiconductor device of claim 13, wherein the second insulating layer comprises aluminum oxide.

16. The semiconductor device of claim 14, wherein the second insulating layer comprises silicon nitride or silicon oxynitride, and the first insulating layer comprises silicon oxide.

17. The semiconductor device of claim 1, wherein a dielectric constant of the second insulating layer is higher than a dielectric constant of the first insulating layer.

18. The semiconductor device of claim 1, wherein the second insulating layer comprises oxygen and at least one element selected from the group consisting of hafnium, zirconium, and yttrium.

19. The semiconductor device of claim 18, wherein the second insulating layer comprises hafnium oxide, hafnium silicate, zirconium oxide, zirconium silicate, or yttrium oxide.

* * * * *